(12) United States Patent
Chen et al.

(10) Patent No.: US 12,021,064 B2
(45) Date of Patent: Jun. 25, 2024

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Hsien-Wei Chen, Hsinchu (TW); Shin-Puu Jeng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 144 days.

(21) Appl. No.: 17/388,788

(22) Filed: Jul. 29, 2021

(65) Prior Publication Data
US 2022/0352123 A1     Nov. 3, 2022

Related U.S. Application Data

(60) Provisional application No. 63/183,135, filed on May 3, 2021.

(51) Int. Cl.
| | |
|---|---|
| *H01L 21/00* | (2006.01) |
| *H01L 23/00* | (2006.01) |
| *H01L 23/48* | (2006.01) |
| *H01L 25/00* | (2006.01) |
| *H01L 25/065* | (2023.01) |

(52) U.S. Cl.
CPC ........ *H01L 25/0657* (2013.01); *H01L 23/481* (2013.01); *H01L 24/16* (2013.01); *H01L 24/81* (2013.01); *H01L 25/50* (2013.01); *H01L 2224/16227* (2013.01); *H01L 2225/06517* (2013.01)

(58) Field of Classification Search
CPC ... H01L 25/0657; H01L 23/481; H01L 24/16; H01L 24/81
See application file for complete search history.

(56) References Cited

U.S. PATENT DOCUMENTS

| | | | |
|---|---|---|---|
| 11,380,611 B2* | 7/2022 | Chen | H01L 25/50 |
| 11,450,581 B2* | 9/2022 | Lo | H01L 23/3135 |
| 2017/0140947 A1* | 5/2017 | Tsai | H01L 21/561 |
| 2018/0082964 A1* | 3/2018 | Wu | H01L 23/5383 |
| 2018/0122781 A1* | 5/2018 | Chen | H01L 24/49 |
| 2020/0161235 A1* | 5/2020 | Kwon | H01L 23/5223 |
| 2021/0091084 A1* | 3/2021 | Yu | H01L 25/50 |
| 2021/0202389 A1* | 7/2021 | Hsieh | H01L 24/96 |
| 2021/0407920 A1* | 12/2021 | Chen | H01L 23/5389 |
| 2022/0328395 A1* | 10/2022 | Chen | H01L 23/49861 |
| 2022/0328467 A1* | 10/2022 | Chen | H01L 25/18 |

(Continued)

FOREIGN PATENT DOCUMENTS

| | | | |
|---|---|---|---|
| DE | 102020130996 A1 * | 11/2021 | H01L 21/486 |
| TW | 202021139 A | 6/2020 | |

*Primary Examiner* — Laura M Menz
(74) *Attorney, Agent, or Firm* — Slater Matsil, LLP

(57) ABSTRACT

Three dimensional structures and methods are provided in which capacitors are formed separately from a first semiconductor device and then connected to the first semiconductor device. For example, a capacitor chip is provided and then bonded to a first semiconductor die. The capacitor chip and the first semiconductor die are encapsulated with a first encapsulant, and one of the capacitor chips and the first semiconductor die are thinned to expose through vias.

20 Claims, 28 Drawing Sheets

(56) References Cited

U.S. PATENT DOCUMENTS

| | | | | |
|---|---|---|---|---|
| 2022/0352123 | A1* | 11/2022 | Chen | H01L 25/50 |
| 2022/0367466 | A1* | 11/2022 | Yu | H01L 24/80 |
| 2022/0384212 | A1* | 12/2022 | Chang | H01L 21/568 |
| 2023/0260896 | A1* | 8/2023 | Hu | H01L 21/6835 |

* cited by examiner

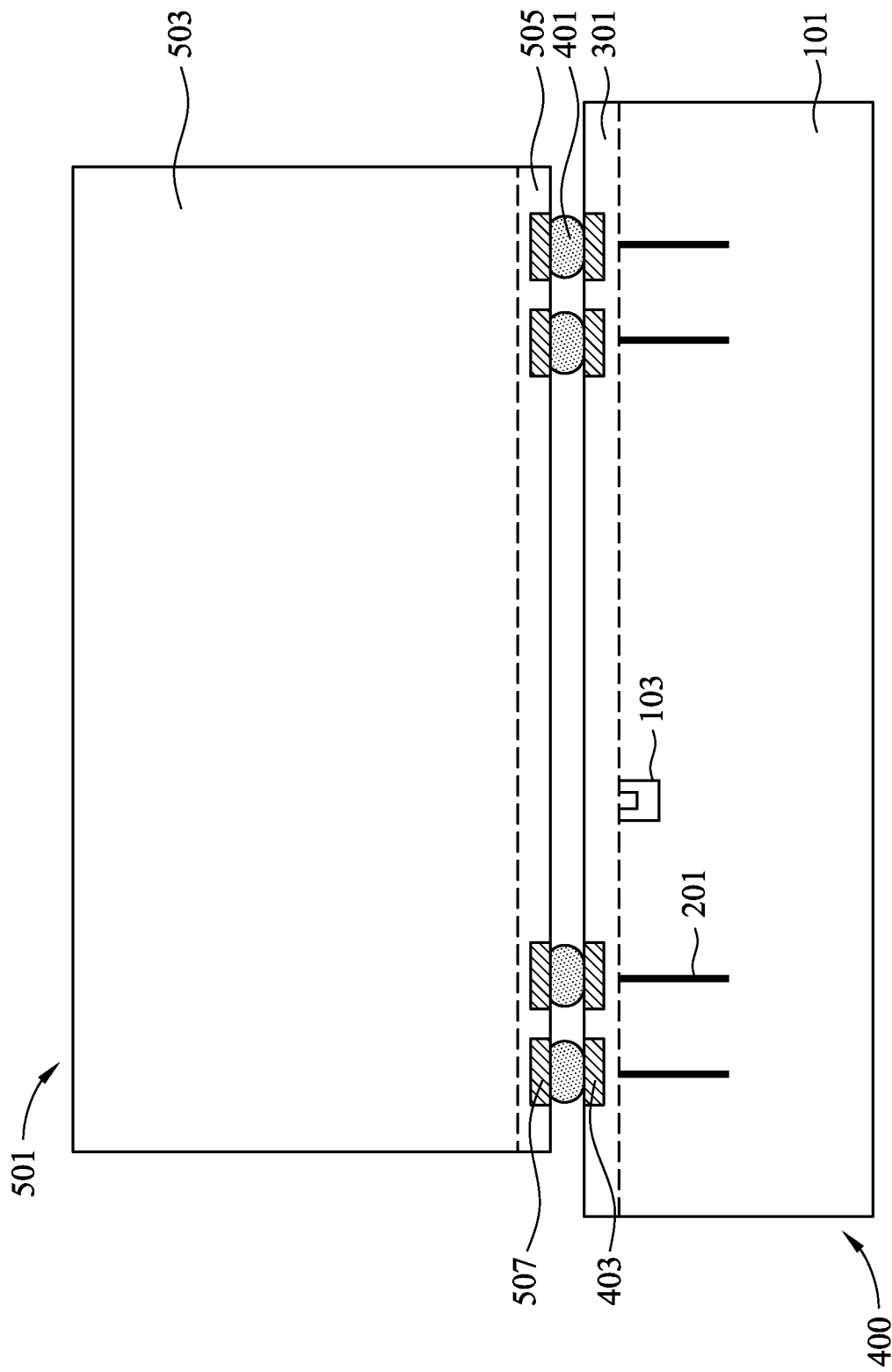

SEMICONDUCTOR DEVICES AND METHODS OF MANUFACTURE

PRIORITY CLAIM AND CROSS-REFERENCE

This application claims the benefit of U.S. Provisional Application No. 63/183,135, filed on May 3, 2021, which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as effective to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device. However, further improvements are desired in order to further reduce the size and improve the operating characteristics of the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5B illustrate bonding of a first semiconductor device, in accordance with some embodiments.

DETAILED DESCRIPTION

Figure 1:
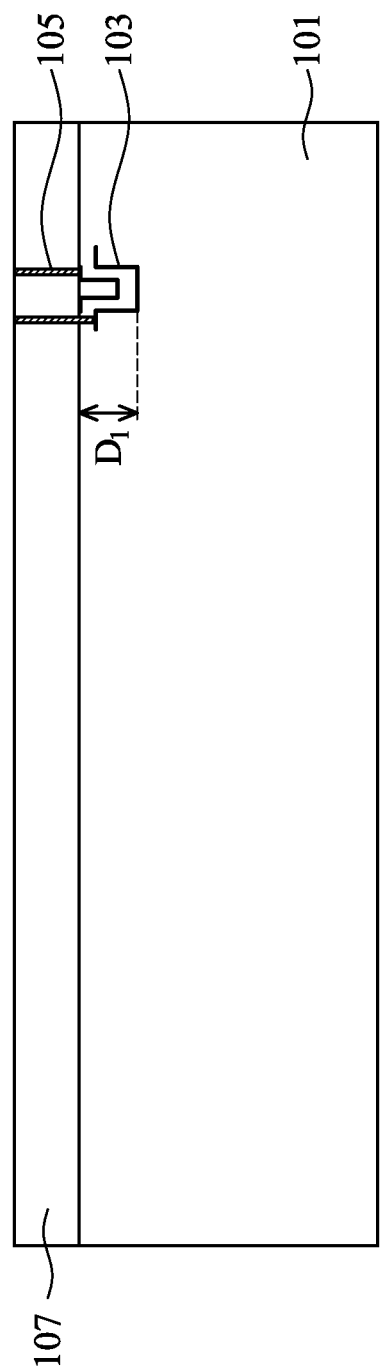
FIG. 1 illustrates formation of a capacitor, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments in which a 3D structure with a system-on-chip/deep trench capacitor die-to-die integration through microbumps is used to provide large, extreme capacitance, which can help enable the system-on-chip's large voltage applications. The embodiments described, however, are not intended to be limiting, as the ideas presented herein can be utilized in a wide variety of embodiments, and all such embodiments may be fully intended to be included within the scope of the embodiments.

With reference now to FIG. 1, there is illustrated a semiconductor substrate 101 with capacitors 103 formed either within or on the semiconductor substrate 101. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

In an embodiment the semiconductor substrate 101 is inactive, such that the semiconductor substrate 101 does not comprise any active devices (transistors, etc.). As such, the semiconductor substrate 101 is formed to be free of other active devices except for the capacitors 103. However, in other embodiments the semiconductor substrate 101 may have active devices formed therein. Any suitable combination may be utilized.

Openings are formed within the semiconductor substrate 101 to accommodate the formation of deep trench capacitors using conductive material and dielectric material. In an embodiment the openings may be formed using one or more photolithographic masking and etching processes, such as the use of a photomask followed by an anisotropic etching process to remove portions of the semiconductor substrate 101. However, any suitable process may be utilized.

Once the openings have been formed, a liner may be deposited to line the openings, followed by a series of alternating layers of conductive material and dielectric material (not separately illustrated for clarity). In an embodiment the liner may be a dielectric material such as silicon oxide, the conductive material may be a conductive material such as titanium nitride, and the dielectric material may be one or more layers of high-k dielectric materials, such as zirconium oxide, aluminum oxide, hafnium oxide, combinations of these, or the like. Each layer may be deposited using a deposition process such as chemical vapor deposition, physical vapor deposition, atomic layer deposition, combinations of these, or the like, until there are four layers of the conductive material and four layers of the dielectric material. However, any suitable materials, processes, and number of alternating layers may be utilized.

In a particular embodiment, the capacitor 103 is a deep trench capacitor. For example, the capacitor 103 may be formed to extend into the semiconductor substrate 101 a first distance $D_1$ of between about 5 µm and about 10 µm. However, any suitable type of capacitor and any suitable distance can be employed.

Once the capacitor 103 has been formed, contacts 105 to overlying first metallization layers 301 (not illustrated in FIG. 1 but illustrated and described further below with respect to FIG. 3) may be formed. In an embodiment the contacts 105 may be formed using damascene or dual damascene processes, such as by initially depositing a dielectric layer 107, patterning the dielectric layer 107 to expose the underlying conductive material, overfilling the openings with another conductive material, and planarizing the conductive material to form the contacts 105. However, any suitable methods may be utilized to form the contacts 105.

Figure 2:
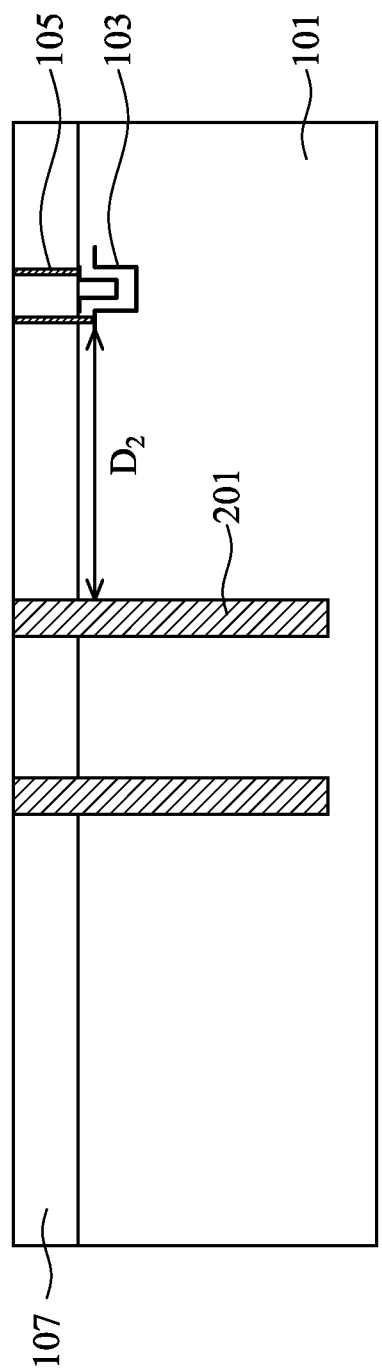
FIG. 2 illustrates formation of through vias, in accordance with some embodiments.

FIG. 2 illustrates formation of through vias 201 that extend at least partially through the semiconductor substrate 101. In an embodiment the through vias 201 may be formed by initially forming through silicon via (TSV) openings into the semiconductor substrate 101 and (if desired, through the dielectric layer 107). The TSV openings may be formed by applying and developing a suitable photoresist (not shown), and removing portions of the semiconductor substrates 101 and the dielectric layer 107 that are exposed to the desired depth. The TSV openings may be formed so as to extend into the semiconductor substrate 101 at least further than the devices formed within and/or on the semiconductor substrates 101, and may extend to a depth greater than the eventual desired height of the semiconductor substrates 101. Accordingly, while the depth is dependent upon the overall designs, the depth may be between about 20 µm and about 200 µm.

Once the TSV openings have been formed within the semiconductor substrates 101, the TSV openings may be lined with a liner. The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. Additionally, the liner may be formed to a thickness of between about 0.1 µm and about 5 µm, such as about 1 µm.

Once the liner has been formed along the sidewalls and bottom of the TSV openings, a barrier layer (also not independently illustrated) may be formed and the remainder of the TSV openings may be filled with first conductive material. The first conductive material may comprise copper, although other suitable materials such as aluminum, alloys, doped polysilicon, combinations thereof, and the like, may alternatively be utilized. The first conductive material may be formed by electroplating copper onto a seed layer (not shown), filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used.

Additionally, the through vias 201 may be formed a sufficient distance away from the capacitor 103 so that the use of the through vias 201 does not significantly interfere with the functionality of the capacitor 103. In an embodiment the through vias may be spaced a second distance $D_2$ that is at least as large as the critical dimensions (CD) of the through vias 201, such as >/=1× the through vias CD, between about 5× and about 20× the critical dimensions of the through vias 201. However, any suitable distance may be utilized.

Figure 3:
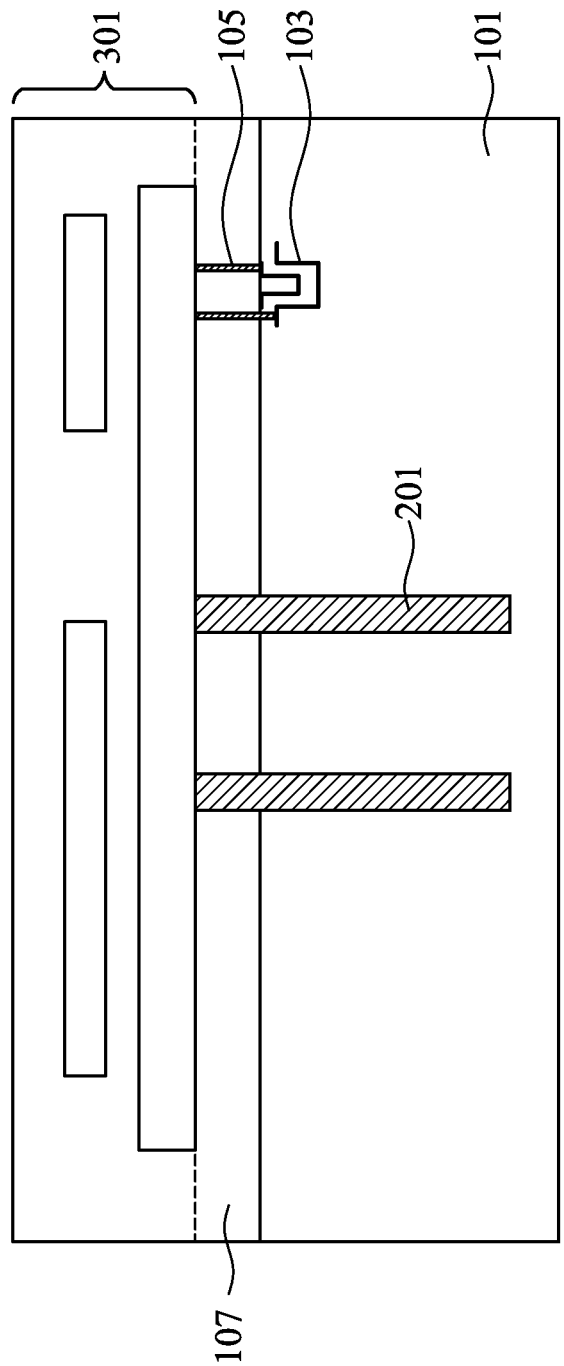
FIG. 3 illustrates formation of metallization layers, in accordance with some embodiments.

FIG. 3 illustrates that, once the through vias 201 have been formed, first metallization layers 301 are formed in order to interconnect the contacts 105 and the through vias 201 to each other and to first external connectors 401 (not illustrated in FIG. 3 but illustrated and described further below with respect to FIG. 4). In an embodiment the first metallization layers 301 are formed of alternating layers of dielectric and conductive material and may be formed through any suitable process (such as deposition, damascene, dual damascene, etc.). In an embodiment there may be four layers of metallization separated from the semiconductor substrate 101, but the precise number of first metallization layers 301 is dependent upon the design.

Figure 4:
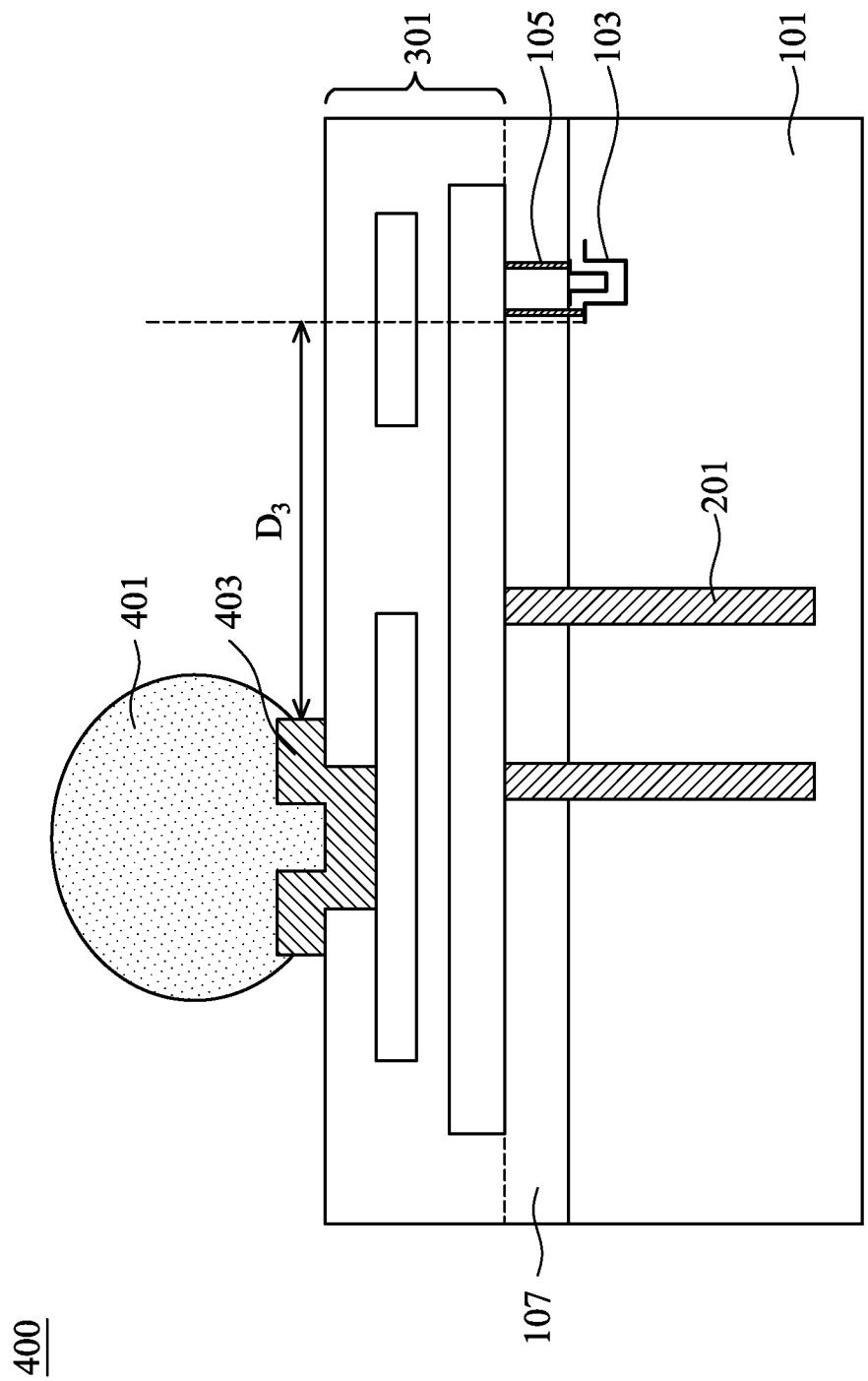
FIG. 4 illustrates formation of external connectors, in accordance with some embodiments.

FIG. 4 illustrates formation of first underbump metallizations 403 along with the first external connectors 401. In an embodiment the first underbump metallizations 403 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the first underbump metallizations 403. Any suitable materials or layers of material that may be used for the first underbump metallizations 403 are fully intended to be included within the scope of the embodiments.

In an embodiment the first underbump metallizations 403 are created by forming each layer over the first metallization layers 301. The forming of each layer may be performed using a plating process, such as electrochemical plating, although other processes of formation, such as sputtering, evaporation, or PECVD process, may be used depending upon the desired materials. The first underbump metallizations 403 may be formed to have a thickness of between about 0.7 µm and about 10 µm, such as about 5 µm.

In another embodiment the first underbump metallizations 403 may be a contact pad, whereby a conductive material such as aluminum is blanket deposited over the structure. Once in place the conductive material is patterned in the desired shape of the first underbump metallization 403 or contact pad, and then a dielectric material is deposited and patterned in order to protect the first underbump metallizations 403 while still exposing a portion for connection to the first external connectors 401. However, any suitable conductive connections may be utilized.

The first external connectors 401 may be contact bumps such as microbumps or controlled collapse chip connection (C4) bumps and may comprise a material such as tin, or other suitable materials, such as silver or copper. In an embodiment in which the first external connectors 401 are tin solder bumps, the first external connectors 401 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Additionally, in order to help reduce the bump stress damage on capacitor 103, the first underbump metallizations 403 may be spaced a third distance $D_3$ apart from the capacitors 103 in order to help avoid noise and the possibility of cracking. In an embodiment the third distance $D_3$ may be between about 50 µm and about 80_µm. However, any suitable distance may be utilized.

Optionally, at this point a singulation may be performed. In an embodiment the singulation may be performed using one or more saw blades. However, any suitable method of singulation, including laser ablation or one or more wet etches, may also be utilized. By performing the singulation at this point, a deep trench capacitor (DTC) chip 400 may be formed.

FIG. 5A illustrates a bonding of a first semiconductor device 501 to the DTC chip 400 using, e.g., the first external connectors 401, in a face-to-face bonding configuration. In an embodiment the first semiconductor device 501 may be a system-on-chip device, such as a logic device, that is designed in order to operate with other devices in order to provide a desired functionality. However, any suitable functionality, or combination of functionalities, such as logic dies, central processing unit (CPU) dies, memory dies, input/output dies, combinations of these, or the like, may be utilized, and all such types may be fully intended to be included within the scope of the embodiments.

In some embodiments the first semiconductor device 501 may comprise a second semiconductor substrate 503, first active devices (not separately illustrated, and which may or may not comprise additional capacitors), second metallization layers 505, and second underbump metallization layers 507. In an embodiment the second semiconductor substrate 503 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices (not separately illustrated in FIG. 5A) may be formed on the second semiconductor substrate 503. In an embodiment the active devices may comprise a wide variety of active devices such as transistors and the like and passive devices such as capacitors, resistors, inductors and the like that may be used to generate the desired structural and functional parts of the design. The active devices and passive devices may be formed using any suitable methods either within or else on the second semiconductor substrate 503.

The second metallization layers 505 are formed over the second semiconductor substrate 503 and the active devices and are designed to connect the various active devices to form functional circuitry for the design. In an embodiment the second metallization layers 505 are formed of alternating layers of dielectric and conductive material and may be formed through any suitable process (such as deposition, damascene, dual damascene, etc.). In an embodiment there may be one to twelve layers of metallization separated from the second semiconductor substrate 503 by at least one interlayer dielectric layer (ILD), but the precise number of metallization layers is dependent upon the design.

In an embodiment the second underbump metallization layers 507 may be formed using similar materials and similar processes as the first underbump metallizations 403. For example, the second underbump metallization layers 507 may comprise an arrangement of chrome/chrome-copper alloy/copper/gold, or else may be a contact pad such as an aluminum contact pad. Any suitable underbump metallization may be utilized.

Once formed, the first semiconductor device 501 may be bonded to the DTC chip 400, for example, using a pick-and-place tool in order to physically align the second underbump metallization layers 507 with individual ones of the first external connectors 401. In an embodiment in which the first external connectors 401 uses connectors such as solder balls, once the first semiconductor device 501 has been placed a reflow process may be performed in order to physically bond the first semiconductor device 501 with the underlying first external connectors 401. However, any other suitable connector or connection process may be utilized, such as metal-to-metal bonding or the like.

Figure 5B:
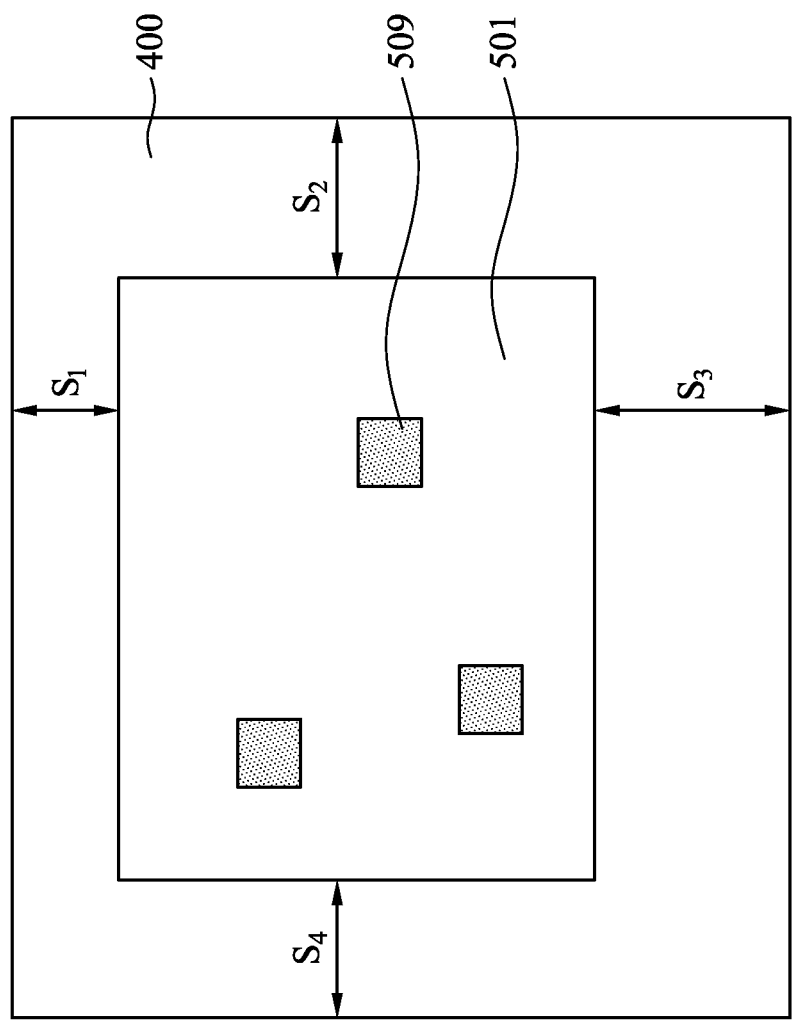

FIG. 5B illustrates a top down view of the first semiconductor device 501 and the DTC chip 400. In an embodiment the first semiconductor device 501, because it is smaller than the DTC chip 400, will have sidewalls spaced apart (in the top down view) from the sidewalls of the DTC chip 400 by, e.g., a first spacing $S_1$, a second spacing $S_2$, a third spacing $S_3$, and a fourth spacing $S_4$. While the first spacing $S_1$, the second spacing $S_2$, the third spacing $S_3$ and the fourth spacing $S_4$ may be the same as or different from each other, each of the first spacing $S_1$, the second spacing $S_2$, the third spacing $S_3$ and the fourth spacing $S_4$ may be between about 500 µm and about 800 µm. However, any suitable spacing may be utilized.

FIG. 5B additionally illustrates that capacitor regions 509 (e.g., regions which comprise one or more of the capacitors 103) are located within the vertical projection of the first semiconductor device 501. By locating the capacitor regions 509 (and, hence, the capacitors 103) within the vertical projection, a better overall performance may be achieved by placing the capacitors 103 closer to those portions of the first semiconductor device 501 to which the capacitors 103 are attached. Additionally, the capacitor regions 509 may take up an area (in the top down view) that is less than the area (in the top down view) of the first semiconductor device 501, such as being less than about 10% of the area of the first semiconductor device 501. However, any suitable area may be utilized.

Additionally, while some of the embodiments discussed above utilize a structure in which all of the capacitors 103 are located within the DTC chip 400 and the first semiconductor device 501 does not comprise any functional capacitors, this is intended to be illustrative and is not intended to be limiting. Rather, any suitable combination and location of capacitors may be utilized. For example, in another embodiment, while the DTC chip 400 comprises deep trench capacitors, the first semiconductor device 501 also comprises capacitors, which may be deep trench capacitors or other types of capacitors. In such an embodiment the capacitors 103 located within the DTC chip 400 have a larger capacitance than the capacitors located within the first semiconductor device 501. In a particular embodiment the capacitors 103 located within the DTC chip 400 may have a capacitance of between about 0.32 $\mu F/mm^2$ and about 0.64 $\mu F/mm^2$ while the capacitors within the first semiconductor device 501 may have a capacitance of between about 0.022 $\mu F/mm^2$ and about 0.044 $\mu F/mm^2$. However, any suitable capacitances may be utilized.

Figure 6:
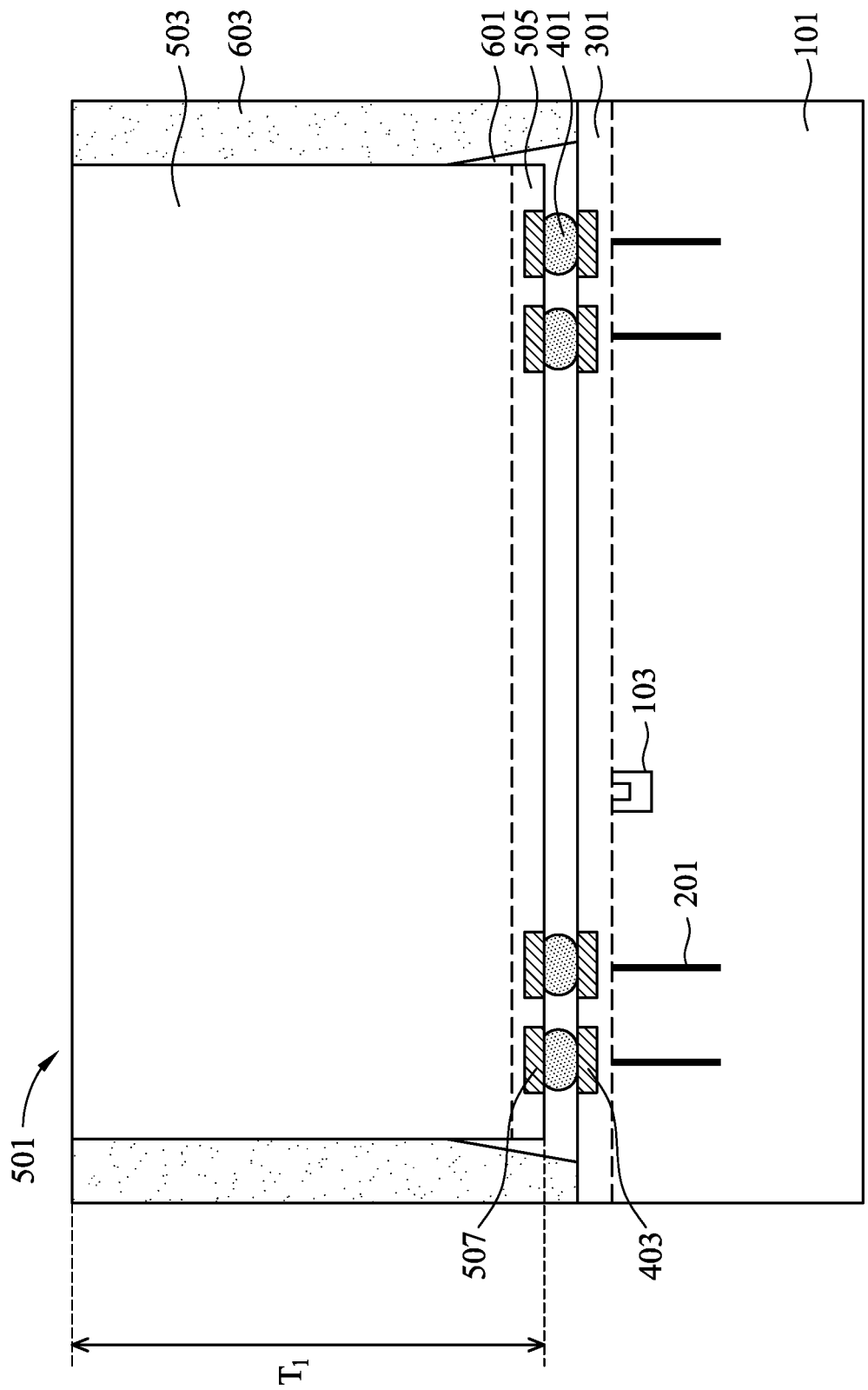
FIG. 6 illustrates an encapsulation, in accordance with some embodiments.

FIG. 6 illustrates that, once the first semiconductor device 501 has been bonded, a first underfill 601 may be applied and then the first semiconductor device 501 is encapsulated with a first encapsulant 603. In an embodiment the first underfill 601 is a protective material used to cushion and support the first semiconductor device 501 and the DTC chip 400 from operational and environmental degradation, such as stresses caused by the generation of heat during operation. The first underfill 601 may be placed using an injection process with capillary action or may be otherwise formed in the space between the first semiconductor device 501 and the DTC chip 400 and may, for example, comprise a liquid epoxy that is dispensed between the first semiconductor device 501 and the DTC chip 400 and then cured to harden.

Once the first underfill 601 has been dispensed, the first encapsulant 603 is disposed to encapsulate the first semiconductor device 501 and the first underfill 601. The encapsulation may be performed in a molding device (not illustrated in FIG. 6), which may comprise a top molding portion and a bottom molding portion separable from the top molding portion. When the top molding portion is lowered to be adjacent to the bottom molding portion, a molding cavity may be formed for the first semiconductor device 501.

During the encapsulation process the top molding portion may be placed adjacent to the bottom molding portion, thereby enclosing the first semiconductor device 501 within the molding cavity. Once enclosed, the top molding portion and the bottom molding portion may form an airtight seal in order to control the influx and outflux of gasses from the molding cavity. Once sealed, the first encapsulant 603 may be placed within the molding cavity. The first encapsulant 603 may be a molding compound resin such as polyimide, PPS, PEEK, PES, a heat resistant crystal resin, combinations of these, or the like. The first encapsulant 603 may be placed within the molding cavity prior to the alignment of the top molding portion and the bottom molding portion, or else may be injected into the molding cavity through an injection port.

Once the encapsulant 603 has been placed into the molding cavity such that the first encapsulant 603 encapsulates the first semiconductor device 501, the first encapsulant 603 may be cured in order to harden the first encapsulant 603 for optimum protection. While the exact curing process is dependent at least in part on the particular material chosen for the first encapsulant 603, in an embodiment in which molding compound is chosen as the first encapsulant 603, the curing could occur through a process such as heating the first encapsulant 603 to between about 100° C. and about 130° C., such as about 125° C. for about 60 sec to about 3000 sec, such as about 600 sec. Additionally, initiators and/or catalysts may be included within the first encapsulant 603 to better control the curing process.

However, as one having ordinary skill in the art will recognize, the curing process described above is merely an exemplary process and is not meant to limit the current embodiments. Other curing processes, such as irradiation or even allowing the first encapsulant 603 to harden at ambient temperature, may also be used. Any suitable curing process may be used, and all such processes may be fully intended to be included within the scope of the embodiments discussed herein.

Additionally, once the encapsulant 603 has been placed, the first encapsulant 603 may be thinned in order to expose the first semiconductor device 501, and to create a first surface which comprises each of the first encapsulant 603 and the first semiconductor device 501. The thinning may be performed, e.g., using a mechanical grinding or chemical mechanical polishing (CMP) process whereby chemical etchants and abrasives are utilized to react and grind away the first encapsulant 603 and the first semiconductor device 501 until the first semiconductor device 501 has been exposed. As such, the first semiconductor device 501 may have a planar surface that is also planar with the first encapsulant 603.

However, while the CMP process described above is presented as one illustrative embodiment, it is not intended to be limiting to the embodiments. Any other suitable removal process may be used to thin the first encapsulant 603 and the first semiconductor device 501. For example, a series of chemical etches may be utilized. This process and any other suitable process may be utilized to thin the first encapsulant 603 and the first semiconductor device 501, and all such processes may be fully intended to be included within the scope of the embodiments.

Additionally, if desired, while the first encapsulant 603 is being thinned, the same thinning process may be utilized to reduce the thickness of the first semiconductor device 501. In such an embodiment, after being thinned the first semiconductor device 501 may have a first thickness $T_1$ of between about 300 μm and about 750 μm. However, any suitable thickness may be utilized.

Figure 7A:
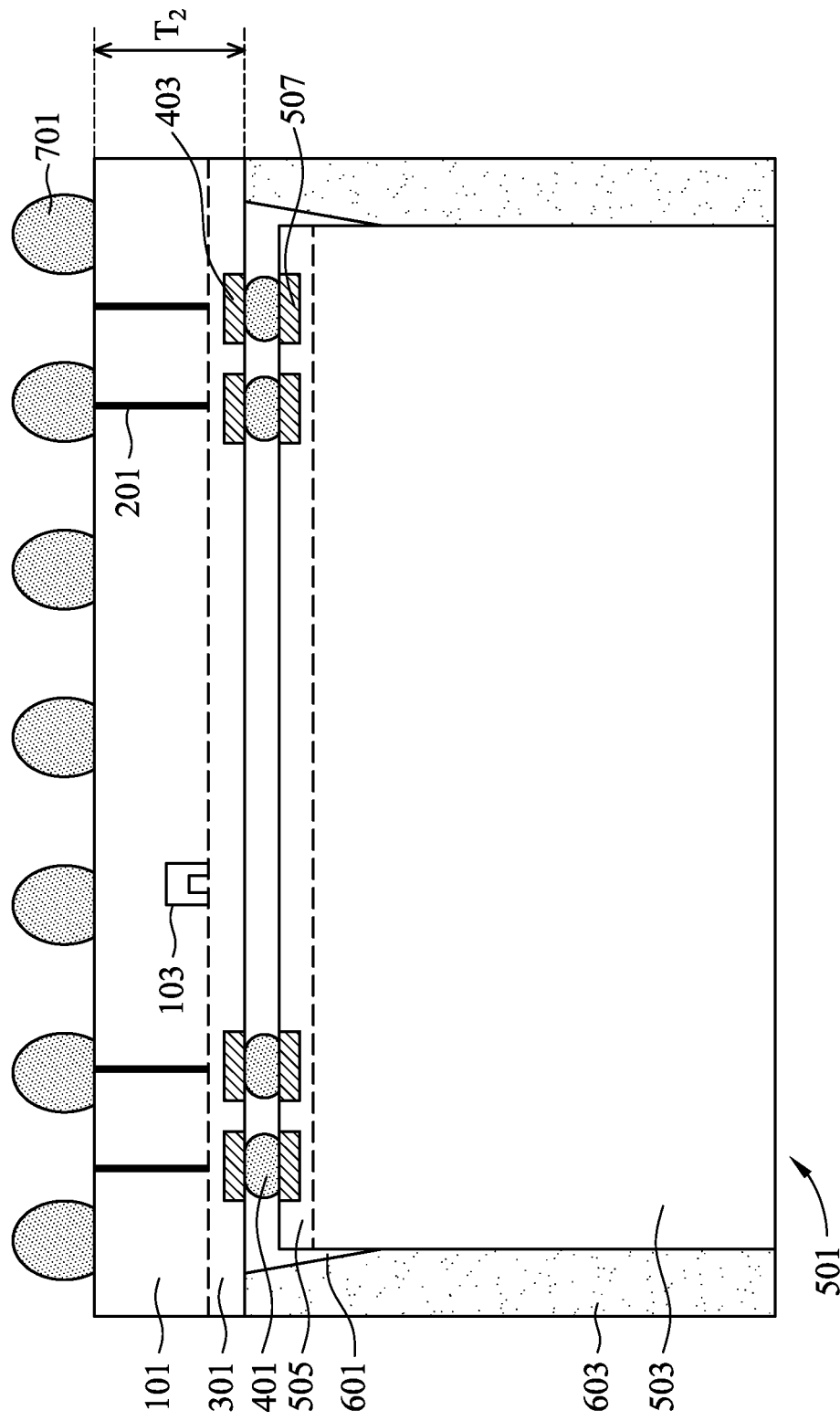
FIGS. 7A-7C illustrate an exposure of the through vias to form an integrated capacitor device, in accordance with some embodiments.

FIG. 7A illustrates that, once the first semiconductor device 501 has been encapsulated, the semiconductor substrate 101 may be thinned in order to expose the through vias 201 for further connections. In an embodiment the thinning may be performed using chemical mechanical polishing (CMP) to remove material of the semiconductor substrate 101 until the conductive portions of the through vias 201 have been exposed and the DTC chip 400 has a second thickness $T_2$ of between about 20 μm and about 40 μm. However, any suitable process, such as grinding or even etch back processes, may be utilized.

Optionally, if desired, third metallization layers 823 (not separately illustrated in FIG. 7A but illustrated and discussed further below with respect to FIG. 8B) may be formed in electrical connection with the through vias 201. In an embodiment the third metallization layers 823 may be similar to and formed the same way as the first metallization layers 301, such as comprising a series of interleaving conductive and dielectric layers formed using damascene and/or dual damascene processes. However, any suitable materials and processes may be utilized.

Once the third metallization layers 823 (if desired) have been formed, second external connections 701 are formed to provide electrical connection to the through vias 201. The second external connections 701 may be contact bumps such as microbumps or controlled collapse chip connection (C4) bumps and may comprise a material such as tin, or other suitable materials, such as silver or copper. In an embodiment in which the second external connections 701 are tin solder bumps, the second external connections 701 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

Additionally, if the semiconductor substrate 101 has not already been singulated, at this point a singulation may be performed in order to form an integrated capacitor structure 700. In an embodiment the singulation may be performed using one or more saw blades. However, any suitable method of singulation, including laser ablation or one or more wet etches, may also be utilized.

In an embodiment once the integrated capacitor structure 700 has been singulated, the first thickness $T_1$ (e.g., of the first semiconductor device 501) is greater than the second thickness $T_2$ (e.g., of the semiconductor substrate 101 with overlying structures). Additionally, the second thickness $T_2$ may be greater than the first distance $D_1$ (of, e.g., the capacitors 103) by at least 30 μm in order to avoid cracking. However, any suitable dimensions may be utilized.

By utilizing the embodiments described above, the first semiconductor device 501 (e.g., the system-on-chip device) can directly access the capacitor 103. Additionally, because the capacitors 103 are located within the semiconductor substrate 101, instead of being located on other structures, the capacitors 103 are located closer to the first semiconductor device 501 and the devices located within the first semiconductor device 501. As such, a larger capacitance can be provided using deep trench capacitors.

Figure 7B:
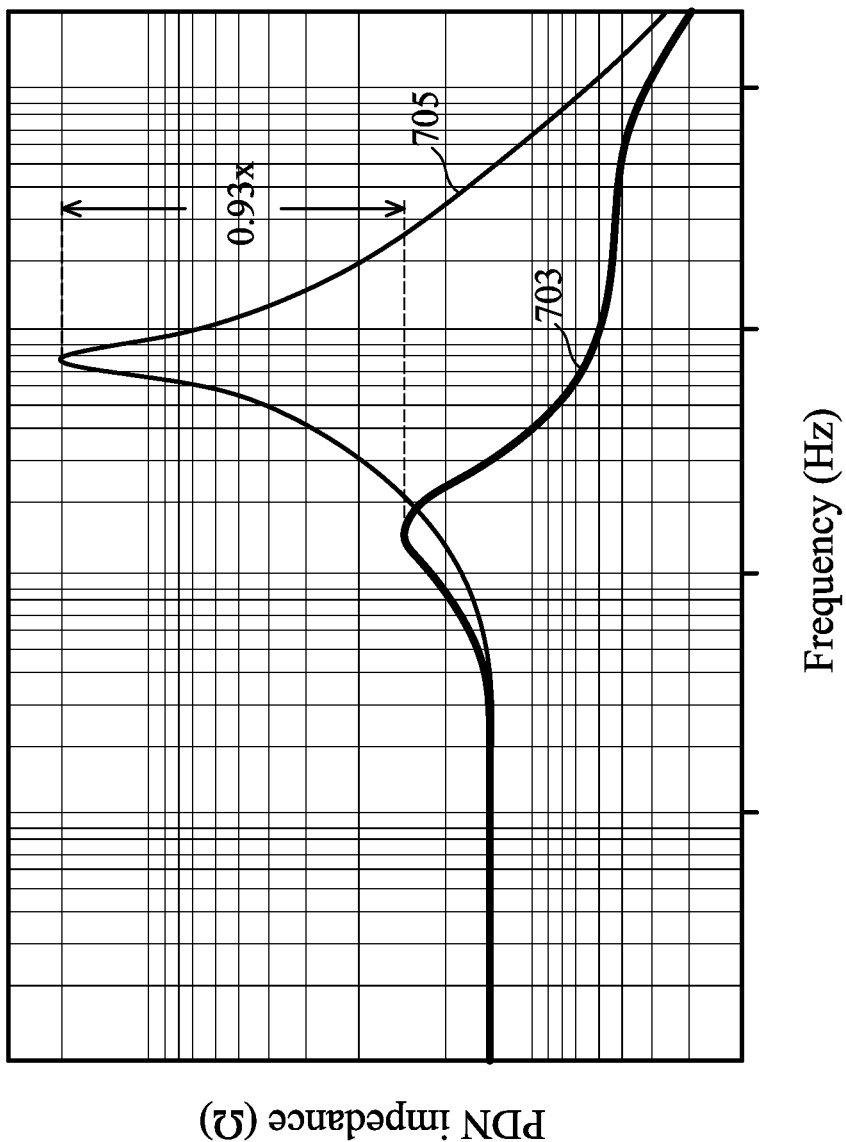
Figure 7C:
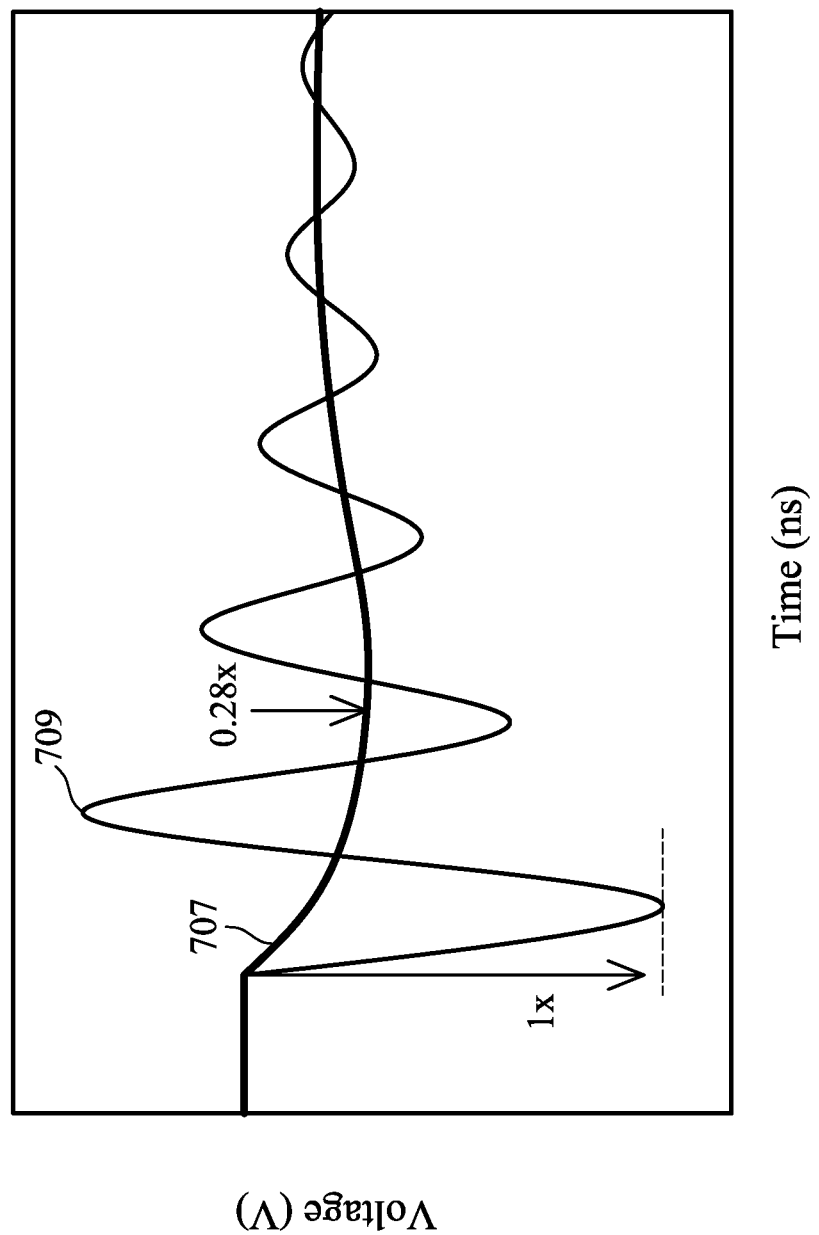

FIGS. 7B-7C illustrate particular improvements that can be obtained using the embodiments discussed herein. Looking first at FIG. 7B (which illustrates a chart of impedance along the Y-axis and a frequency along the X-axis), for example, by forming the capacitors 103 as described and then connecting the first semiconductor device 501, a lower impedance at higher frequencies may be obtained by placing the capacitors 103 off of the first semiconductor device 501 (as illustrated by the line labeled 703) as compared to not placing the capacitors 103 off of the first semiconductor device 501 (as illustrated by the line labeled 705). In the particular embodiment illustrated, by not placing the capacitors 103 as described, the impedance may be as high as 93% higher than by placing the capacitors 103 off of the first semiconductor device 501.

Looking next at FIG. 7C (which illustrates a chart of voltage along the Y-axis and a time along the X-axis), the placement of the capacitors 103 off of the first semiconductor device 501 allows for a more stable voltage to be achieved. In particular, by forming the capacitors 103 as described and then connecting the first semiconductor device 501, less variation in the voltage over time may be obtained by placing the capacitors 103 off of the first semiconductor device 501 (as illustrated by the line labeled 707) as compared to not placing the capacitors 103 off of the first semiconductor device 501 (as illustrated by the line labeled 709). In the particular embodiment illustrated, by placing the capacitors 103 as described, the variation in voltage may be as little as 28% of previous variations by placing the capacitors 103 off of the first semiconductor device 501.

Figure 8A:
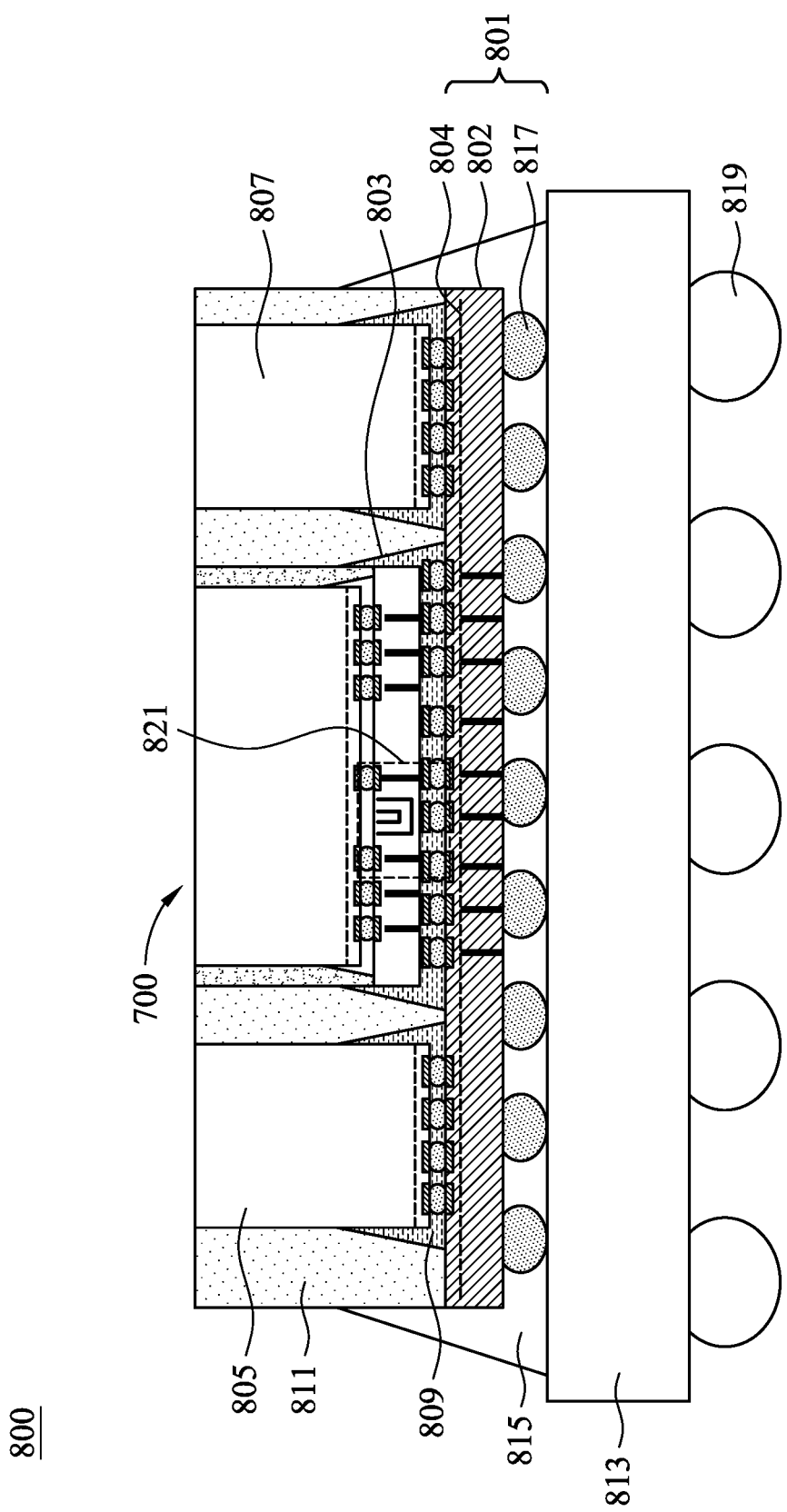
FIGS. 8A-8B illustrate bonding of the through vias to a substrate, in accordance with some embodiments.
Figure 8B:
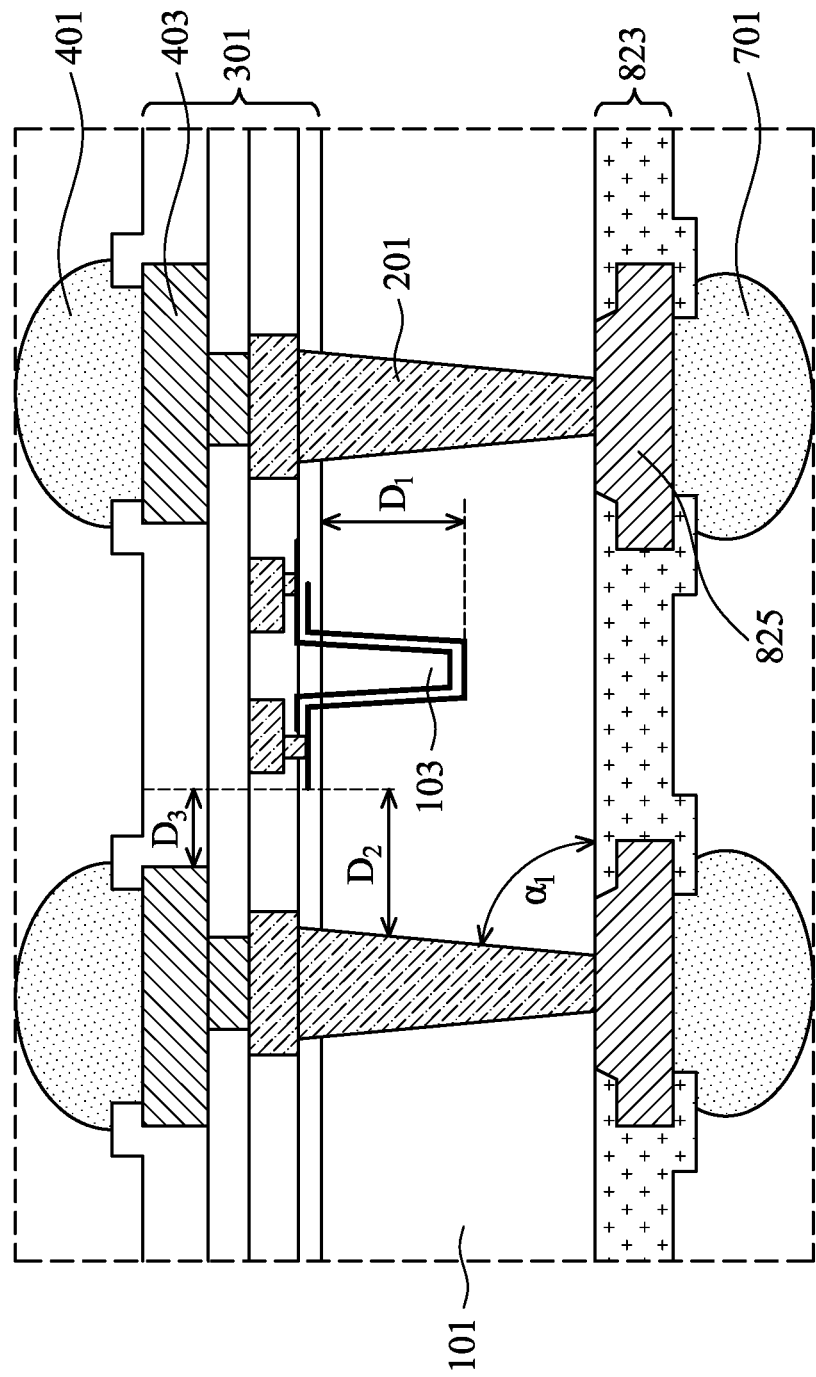

FIGS. 8A-8B illustrate that, once the integrated capacitor structure 700 has been formed, the integrated capacitor structure 700 may be incorporated into a larger structure, such as a chip-on-wafer-on-substrate (CoWoS) structure 800. In this embodiment the integrated capacitor structure 700 is bonded to a first interposer 801 (with a second underfill 803) along with a second semiconductor die 805 and a third semiconductor die 807. In an embodiment the second semiconductor die 805 and the third semiconductor die 807 may be semiconductor devices such as logic dies, DRAM dies, SRAM dies, central processing unit dies, I/O dies, combinations of these, or the like. Additionally, while the second semiconductor die 805 and the third semiconductor die 807 may be the same type of device (e.g., both be DRAM dies), they may also be different types of devices (e.g., one may be a logic die and another may be a DRAM die such as a high bandwidth memory (HBM) die). The second semiconductor die 805 and the third semiconductor die 807 may also comprise a stack of multiple dies. Any suitable combination of semiconductor dies, and any number of semiconductor dies, may be utilized, and all such numbers, combinations, and functionalities may be fully intended to be included within the scope of the embodiments.

Looking next at the first interposer 801, the first interposer 801 may comprise an interposer substrate 802 with through substrate vias (TSVs). In this embodiment the interposer substrate 802 may be, e.g., a silicon substrate, doped or undoped, or an active layer of a silicon-on-insulator (SOI) substrate. However, the interposer substrate 802 may also be a glass substrate, a ceramic substrate, a polymer substrate, or any other substrate that may provide a suitable protection and/or interconnection functionality. These and any other suitable materials may alternatively be used for the interposer substrate 802.

In some embodiments, the interposer substrate 802 may include electrical elements, such as resistors, capacitors, signal distribution circuitry, combinations of these, or the like. These electrical elements may be active, passive, or a combination thereof. In other embodiments, the interposer substrate 802 is free from both active and passive electrical elements therein. All such combinations may be fully intended to be included within the scope of the embodiments.

Additionally, if desired, interposer metallization layers 804 may be formed on one or more of the sides of the interposer substrate 802. The interposer metallization layers 804 may comprise alternating layers of conductive materials and dielectric materials along with any desired underbump metallization layers and/or contact pads to allow for electrical connections. Any suitable structures may be utilized.

The second semiconductor die 805 and the third semiconductor die 807 may be bonded to the first interposer 801, and a third underfill 809 may be placed between them.

Additionally, in order to protect the structure, the second semiconductor die 805 and the third semiconductor die 807 may be encapsulated over the first interposer 801 with, e.g., a second encapsulant 811, using similar processes and materials as the first encapsulant 603. However, any suitable methods and materials may be utilized.

The first interposer 801 may be bonded to a third substrate 813 (with, e.g., a fourth underfill 815 between them) using third external connectors 817 (which may be similar to the first external connectors 401) to form the chip on wafer on substrate (CoWoS) structure 800. In an embodiment the third substrate 813 may be a printed circuit board such as a laminate substrate formed as a stack of multiple thin layers (or laminates) of a polymer material such as bismaleimide triazine (BT), FR-4, ABF, or the like, with fourth external connectors 819 (which may also be similar to the first external connectors 401). However, any other suitable substrate, such as a silicon interposer, a silicon substrate, organic substrate, a ceramic substrate, or the like, may alternatively be utilized, and all such redistributive substrates that provide support and connectivity may be fully intended to be included within the scope of the embodiments.

FIG. 8B illustrates a close-up view of the section of FIG. 8A in the dashed box labeled 821. As can be seen in this close up view, the capacitors 103 extend into, but not through, the semiconductor substrate 101 and is electrically connected to the first metallization layers 301. Additionally, the through vias 201 extends through the semiconductor substrate 101 and electrically connects the first metallization layers 301 (and, hence, the first external connectors 401) to the third metallization layers 823 and the second external connections 701. In this embodiment, the third metallization layers 823 comprise second underbump metallizations 825 (e.g., copper metallizations) upon which the second external connections 701 may be formed. However, any suitable materials may be utilized.

Additionally, as can be seen more clearly in FIG. 8B, because the through vias 201 are formed as front-side vias, the sidewalls of the through vias 201 may not be perfectly perpendicular but may have, e.g., tapered and angled sidewalls. In some embodiments the tapered and angled sidewalls may have a first angle $\alpha_1$ between the sidewall and a surface of the semiconductor substrate 101 of between about 80° and about 90°. However, any suitable angle may be utilized.

Figure 9:
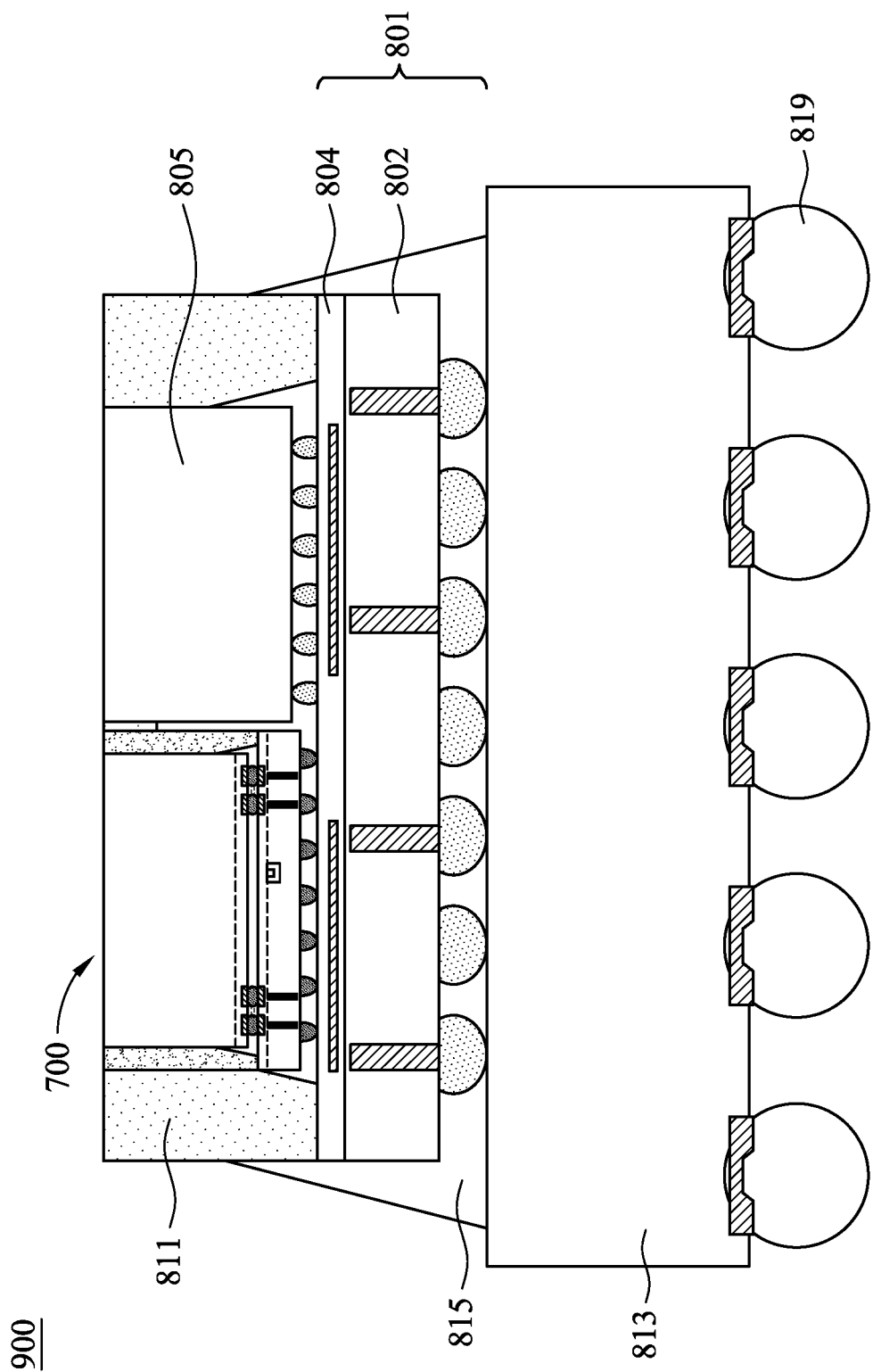
FIG. 9 illustrates connecting the through vias to a first interposer, in accordance with some embodiments.

FIG. 9 illustrates a very particular embodiment of using the integrated capacitor structure 700 in a second system-on-chip-on wafer structure 900. In this embodiment, the integrated capacitor structure 700 is bonded to the first interposer 801 (illustrated in this embodiment with the interposer metallization layer 804 formed on a first side of the interposer substrate 802), and the interposer substrate 802 is a silicon interposer that has through vias extending through the silicon. However, the first interposer 801 can be any other suitable interposer.

Additionally in this embodiment, the integrated capacitor structure 700 is bonded to the first interposer 801 with the second semiconductor die 805 but not the third semiconductor die 807. In this embodiment, the second semiconductor die 805 may be a memory device such as a hybrid memory cube (HMC) module, a high bandwidth memory (HBM) module, or the like that includes multiple memory dies. In such embodiments, the second semiconductor die 805 includes multiple semiconductor substrates interconnected by through-substrate vias (TSVs). Each of the semiconductor substrates may (or may not) have an interconnect structure.

Figure 10:
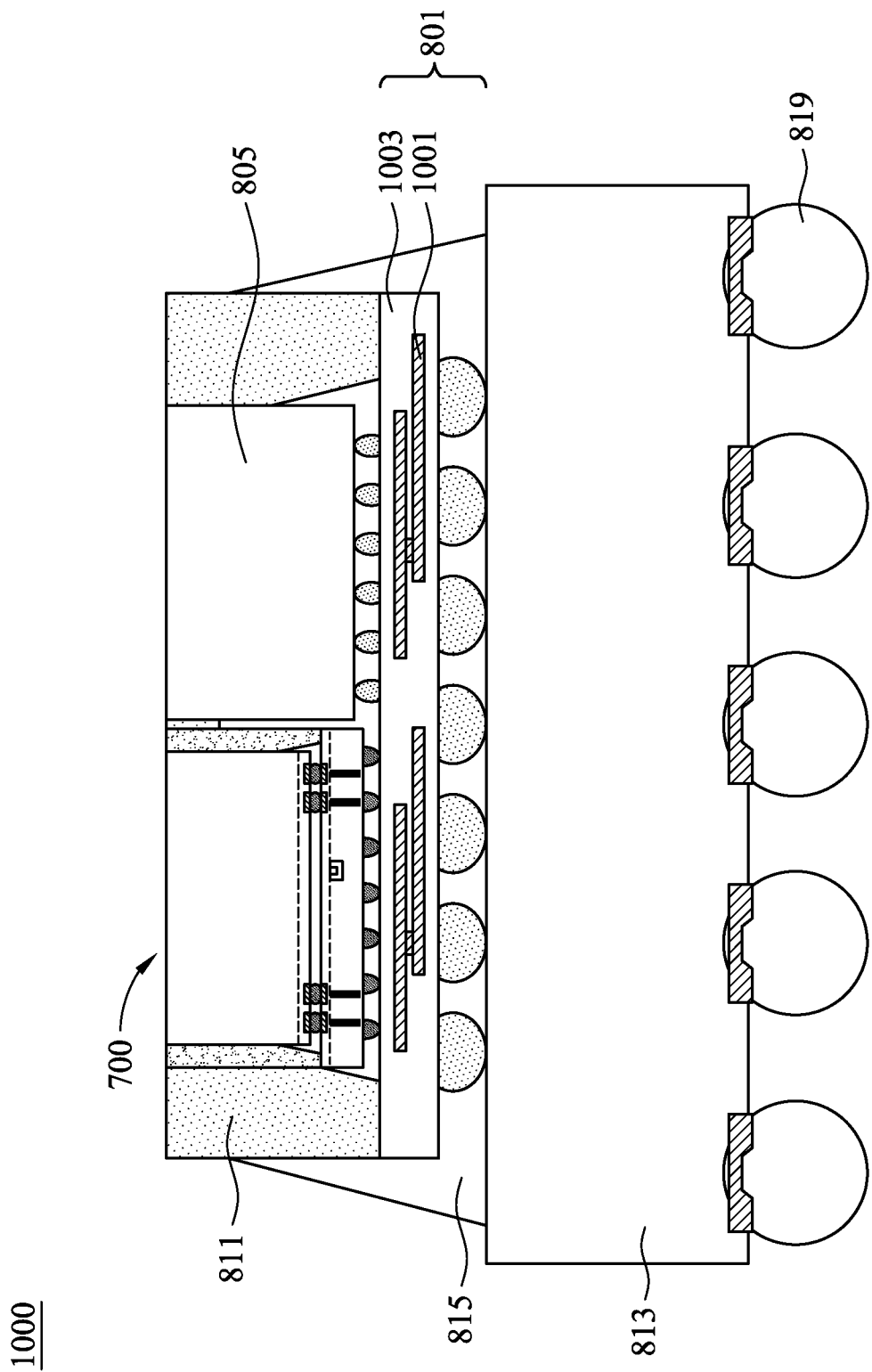
FIG. 10 illustrates connecting the through vias to a second interposer, in accordance with some embodiments.

FIG. 10 illustrates another particular embodiment in which the integrated capacitor structure 700 is used in a third system-on-chip-on wafer structure 1000. While the embodiment illustrated in FIG. 10 is similar to the embodiment illustrated and discussed above with respect to FIG. 9 (e.g., the second semiconductor die 805 is a HBM module), the first interposer 801 in this embodiment is not a silicon interposer but is, instead, an organic interposer.

In this embodiment the first interposer 801 may be formed as an organic interposer with a first redistribution layer, which comprises a series of conductive layers 1001 (such as two, three or four conductive layers) embedded within a series of dielectric layers 1003 (such as four or five dielectric layers) that are utilized to provide not only conductive routing for signals, but which may also be utilized to provide structures such as integrated inductors or capacitors. In an embodiment, a first one of the series of dielectric layers 1003 is formed over, for example, a support substrate (not separately illustrated in FIG. 10), and the first one of the series of dielectric layers 1003 may be a material such as polybenzoxazole (0), although any suitable material, such as polyimide or a polyimide derivative, may be utilized. The first one of the series of dielectric layers 1003 may be placed using, e.g., a spin-coating process, although any suitable method may be used.

After the first one of the series of dielectric layers 1003 has been formed, openings may be made through the first one of the series of dielectric layers 1003 by removing portions of the first one of the series of dielectric layers 1003. The openings may be formed using a suitable photolithographic mask and etching process, although any suitable process or processes may be used to pattern the first one of the series of dielectric layers 1003.

Once the first one of the series of dielectric layers 1003 has been formed and patterned, a first one of the series of conductive layers 1001 is formed over the first one of the series of dielectric layers 1003 and through the openings formed within the first one of the series of dielectric layers 1003. In an embodiment the first one of the series of conductive layers 1001 may be formed by initially forming a seed layer of a titanium copper alloy through a suitable formation process such as CVD or sputtering. A photoresist may then be formed to cover the seed layer, and the photoresist may then be patterned to expose those portions of the seed layer that are located where the first one of the series of conductive layers 1001 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may be used to form the first one of the series of conductive layers. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first one of the series of conductive layers 1001 has been formed, a second one of the series of dielectric layers 1003 and a second one of the series of conductive layers 1001 may be formed by repeating steps similar to the first one of the series of dielectric layers 1003 and the first one of the series of conductive layers 1001. These steps may be repeated as desired in order to electrically connect each of the series of conductive layers 1001 to an underlying one of the series of conductive layers 1001, and may be repeated as often as desired until an uppermost one of the series of conductive layers 1001 and an uppermost one of the series of dielectric layers 1003 has been formed. In an embodiment the deposition and patterning of the series of conductive layers 1001 and the series of dielectric layers 1003 may be continued until the first redistribution layer has a desired number of layers, although any suitable number of individual layers may be utilized.

Once the desired number of conductive layers 1001 and dielectric layers 1003 have been formed, the support substrate is removed, underbump metallizations (if desired) and the third external connectors 817 may be formed to make electrical connection to the first one of the conductive layers 1001. Additionally, the first interposer 801 may then be used to interconnect the third substrate 813 with the integrated capacitor structure 700 and the second semiconductor die 805.

Figure 11:
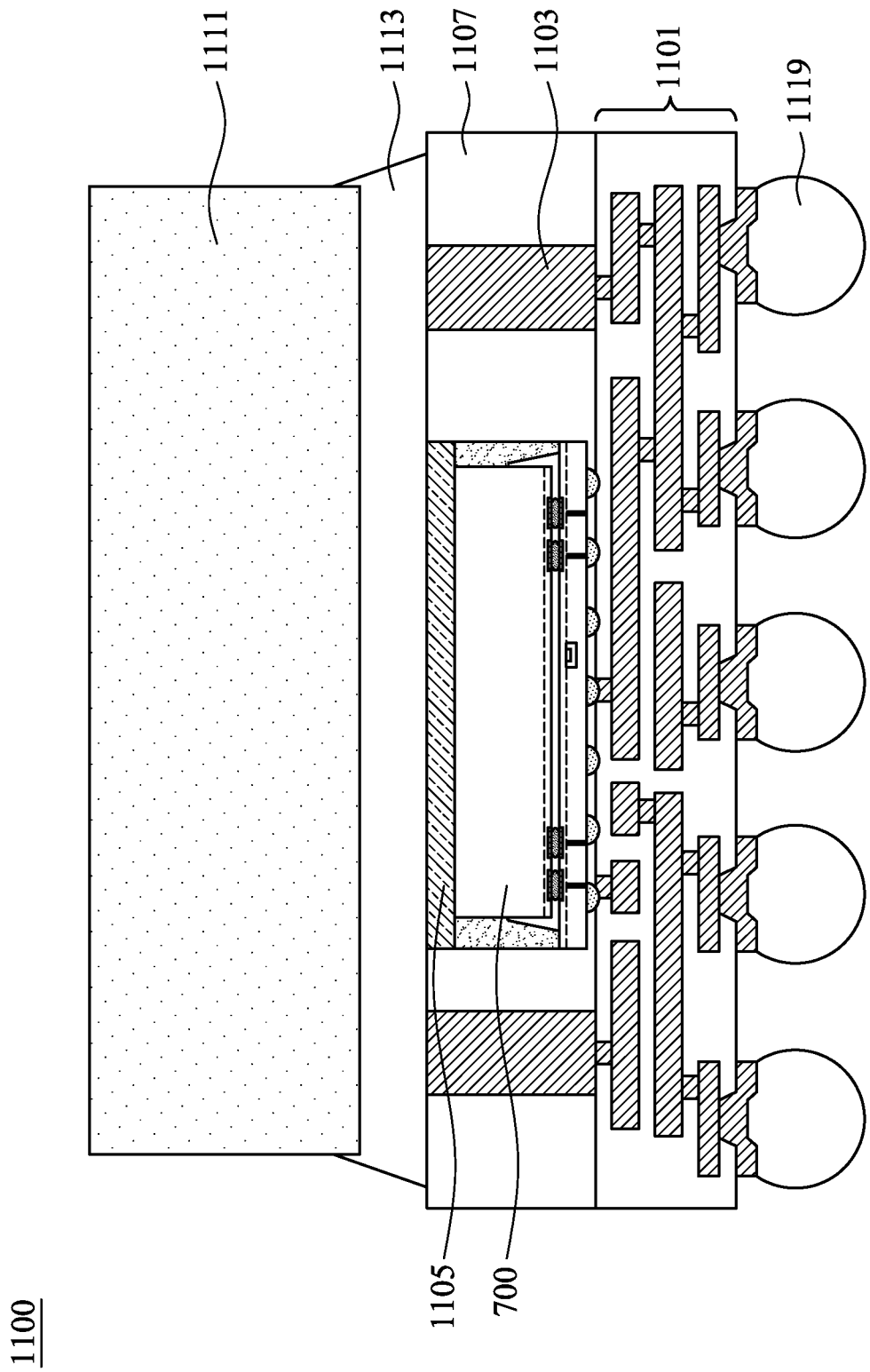
FIG. 11 illustrates connecting the through vias in an integrated fan out package, in accordance with some embodiments.

FIG. 11 illustrates an embodiment in which the integrated capacitor structure 700 is utilized within an integrated fan-out package-on-package (InFO-PoP) structure 1100. In such an embodiment through vias 1103 are initially formed on, e.g., a carrier wafer (not separately illustrated). In an embodiment the through vias 1103 may be formed by initially depositing a seed layer over the carrier wafer. In an embodiment the seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as sputtering, evaporation, or PECVD processes, depending upon the desired materials. The seed layer may be formed to have a thickness of between about 0.3 μm and about 1 μm, such as about 0.5 μm.

A photoresist (not separately illustrated) may be placed on the seed layer using, e.g., a spin coating technique to a height of between about 50 μm and about 250 μm, such as about 120 μm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the through vias 1103. The through vias 1103 are formed in such a placement as to be located on different sides of subsequently attached devices such as the integrated capacitor structure 700. However, any suitable arrangement for the pattern of through vias 1103 may be utilized.

In an embodiment the through vias 1103 are formed within the photoresist. In an embodiment the through vias 1103 comprise one or more conductive materials, such as copper, tungsten, other conductive metals, or the like, and may be formed, for example, by electroplating, electroless plating, or the like. In an embodiment, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the through vias 1103 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the seed layer.

Once exposed a removal of the exposed portions of the seed layer may be performed. In an embodiment the exposed portions of the seed layer (e.g., those portions that are not covered by the through vias 1103) may be removed by, for example, a wet or dry etching process. For example, in a dry etching process reactants may be directed towards the seed layer using the through vias 1103 as masks. In another embodiment, etchants may be sprayed or otherwise put into contact with the seed layer in order to remove the exposed portions of the seed layer.

After the through vias 1103 have been formed, the integrated capacitor structure 700 may be attached to the carrier wafer with, e.g., an adhesive layer 1105. In an embodiment the integrated capacitor structure 700 may be attached using, e.g., a pick-and-place process to place the integrated capacitor structure 700 between the through vias 1103. However, any suitable process may be utilized.

Once the through vias 1103 have been formed and the integrated capacitor structure 700 has been placed, the through vias 1103 and the integrated capacitor structure 700 are encapsulated with a third encapsulant 1107. In an embodiment the through vias 1103 and the integrated capacitor structure 700 can be encapsulated as described above with respect to the first encapsulant 603 and the third encapsulant 1107 may then be thinned to expose the through vias 1103. However, any suitable method may be utilized.

Once encapsulated, first redistribution layers 1101 are formed over the third encapsulant 1107. In an embodiment the first redistribution layers 1101 may be formed by initially forming a seed layer of a titanium copper alloy through a suitable formation process such as CVD or sputtering. Once the seed layer has been deposited, a photoresist may be placed onto the seed layer and patterned to prepare for a formation of the first redistribution layer 1101.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may be used to form the first redistribution layer 1101.

Once the conductive material has been formed, the photoresist may be removed through a suitable removal process such as ashing, wet etching, or plasma etching. Additionally, after the removal of the photoresist, those portions of the seed layer that were covered by the photoresist may be removed through, for example, a suitable etch process using the conductive material as a mask.

A first dielectric layer is deposited over the conductive material in order to provide protection and isolation for the conductive material and the other underlying structures. In an embodiment the first dielectric layer may be polybenzoxazole (PBO), although any suitable material, such as polyimide or a polyimide derivative, may be utilized. The first dielectric layer may be placed using, e.g., a spin-coating process to a thickness of between about 5 µm and about 25 µm, such as about 7 µm, although any suitable method and thickness may be used.

After the first dielectric layer has been formed, first openings may be made through the first dielectric layer by removing portions of the first dielectric layer to expose at least a portion of the underlying conductive material. The first openings allow for contact between the conductive material and a second layer of the conductive material. The first openings may be formed using a suitable photolithographic mask and etching process, although any suitable process to expose portions of the conductive material may be used.

Another layer of conductive material may be formed to provide additional routing and connectivity and in electrical connection with the first layer of conductive material. In an embodiment the second layer of conductive material may be formed similar to the first layer of conductive material. For example, a seed layer may be formed, a photoresist may be placed and patterned on top of the seed layer, and conductive material may be plated into the patterned openings through the photoresist. Once formed, the photoresist may be removed, the underlying seed layer may be etched, the second layer of conductive material may be covered by another passivation layer, and the passivation layer may be patterned to form second openings and expose an underlying conductive portion of the second layer of conductive material.

These steps may be repeated as many times as desired in order to provide the desired number of layers and desired connectivity. As such, while the precise number of different layers may be dependent at least in part on the overall design, in the embodiment illustrated there are three layers of conductive material. However, any suitable number of layers may be utilized.

Fifth external connectors 1109 and underbump metallizations are formed in electrical connection with the first redistribution layers 1101. In an embodiment the underbump metallizations may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations. Any suitable materials or layers of material that may be used for the underbump metallizations are fully intended to be included within the scope of the embodiments.

In an embodiment the underbump metallizations are created by forming each layer over and in electrical connection with the first redistribution layers 1101. The forming of each layer may be performed using a plating process, such as electrochemical plating, although other processes of formation, such as sputtering, evaporation, or PECVD process, may be used depending upon the desired materials. The underbump metallizations may be formed to have a thickness of between about 0.7 µm and about 10 µm, such as about 7 µm.

In an embodiment the fifth external connectors 1109 may be placed on the underbump metallizations and may be a ball grid array (BGA) which comprises a eutectic material such as solder, although any suitable materials may alternatively be used. In an embodiment in which the fifth external connectors 1109 are solder balls, the fifth external connectors 1109 may be formed using a ball drop method, such as a direct ball drop process. Alternatively, the solder balls may be formed by initially forming a layer of tin through any suitable method such as evaporation, electroplating, printing, solder transfer, and then performing a reflow in order to shape the material into the desired bump shape. Once the fifth external connectors 1109 have been formed, a test may be performed to ensure that the structure is suitable for further processing.

After the fifth external connectors 1109 have been formed, the carrier wafer is removed, and a first package 1111 is electrically connected to the through vias 1103. In an embodiment the first package 1111 may comprise a package substrate, a fourth semiconductor die, a fifth semiconductor die (bonded to the fourth semiconductor die), and a fourth encapsulant. In an embodiment the package substrate may be, e.g., a packaging substrate comprising internal interconnects (e.g., through substrate vias) to connect the fourth semiconductor die and the fifth semiconductor die to the vias.

Once bonded, a fifth underfill 1113 is placed between the first package 1111 and the third encapsulant 1107. In an embodiment the fifth underfill 1113 may be placed in a similar fashion as the first underfill 601 described above with respect to FIG. 6. However, any suitable process and material may be utilized.

Figure 12:
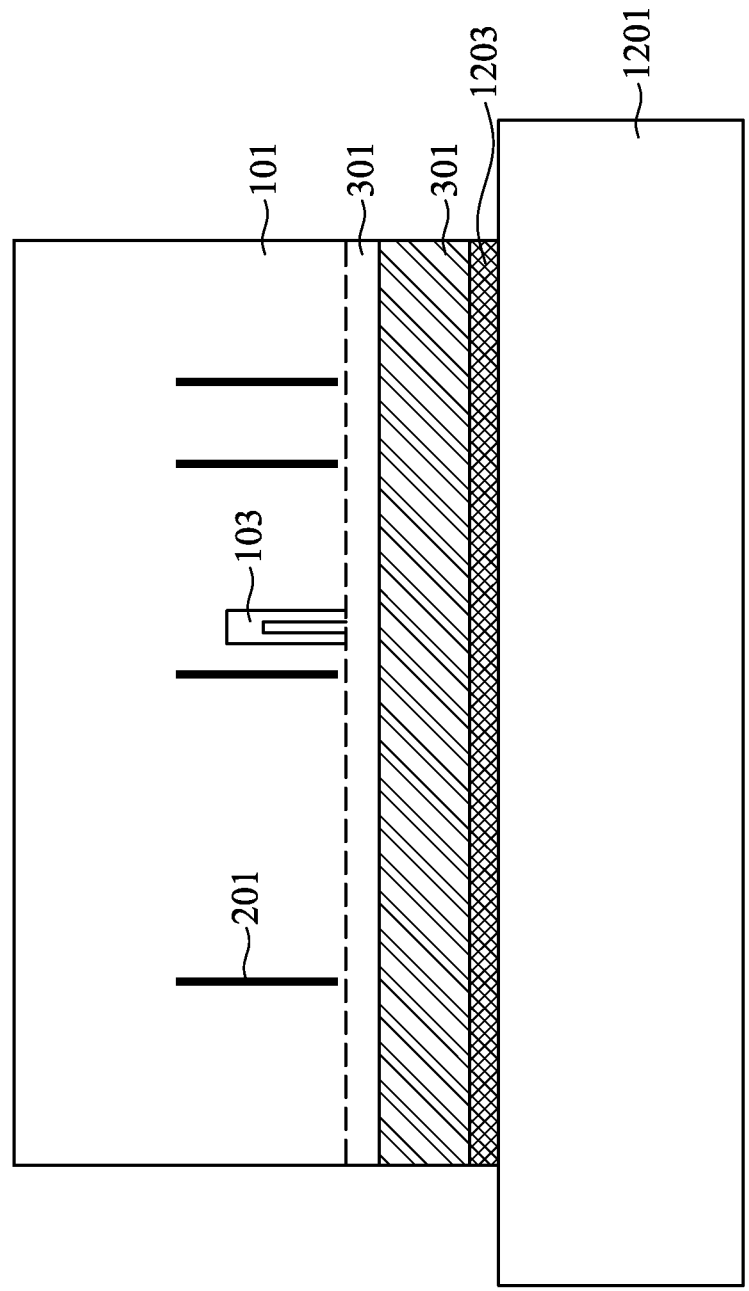
FIG. 12 illustrates attaching a capacitor chip to a carrier wafer, in accordance with some embodiments.

FIG. 12 illustrates another process wherein the first metallization layers 301, instead of immediately being bonded to the first semiconductor device 501 (as described above with respect to FIG. 5) are, instead bonded to a first carrier substrate 1201. The first carrier substrate 1201 comprises, for example, silicon based materials, such as glass or silicon oxide, or other materials, such as aluminum oxide, combinations of any of these materials, or the like. The first carrier substrate 1201 is planar in order to accommodate an attachment of the first metallization layers 301.

The first metallization layers 301 may be attached to the first carrier substrate 1201 using an adhesive 1203. In some embodiments the adhesive 1203 may be an adhesive such as a die attached film (DAF), an epoxy resin, a phenol resin, acrylic rubber, silica filler, or a combination thereof, and is applied using a lamination technique. However, any other suitable alternative material and method of formation may alternatively be utilized.

Figure 13:
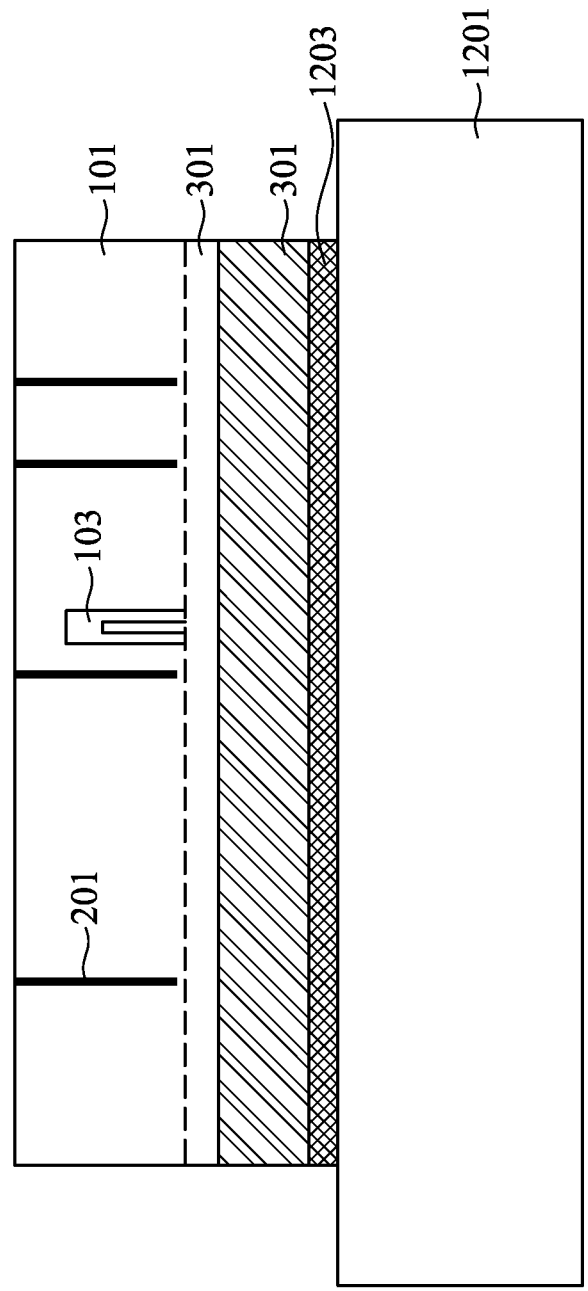
FIG. 13 illustrates thinning the capacitor chip, in accordance with some embodiments.

FIG. 13 illustrates that, once the first metallization layers 301 have been attached to the first carrier substrate 1201, the semiconductor substrate 101 is thinned in order to expose the embedded through vias 201. In an embodiment the thinning may be performed using chemical mechanical polishing (CMP) to remove material of the semiconductor substrate 101 until the conductive portions of the through vias 201 have been exposed. However, any suitable process, such as grinding or even etch back processes, may be utilized.

Figure 14:
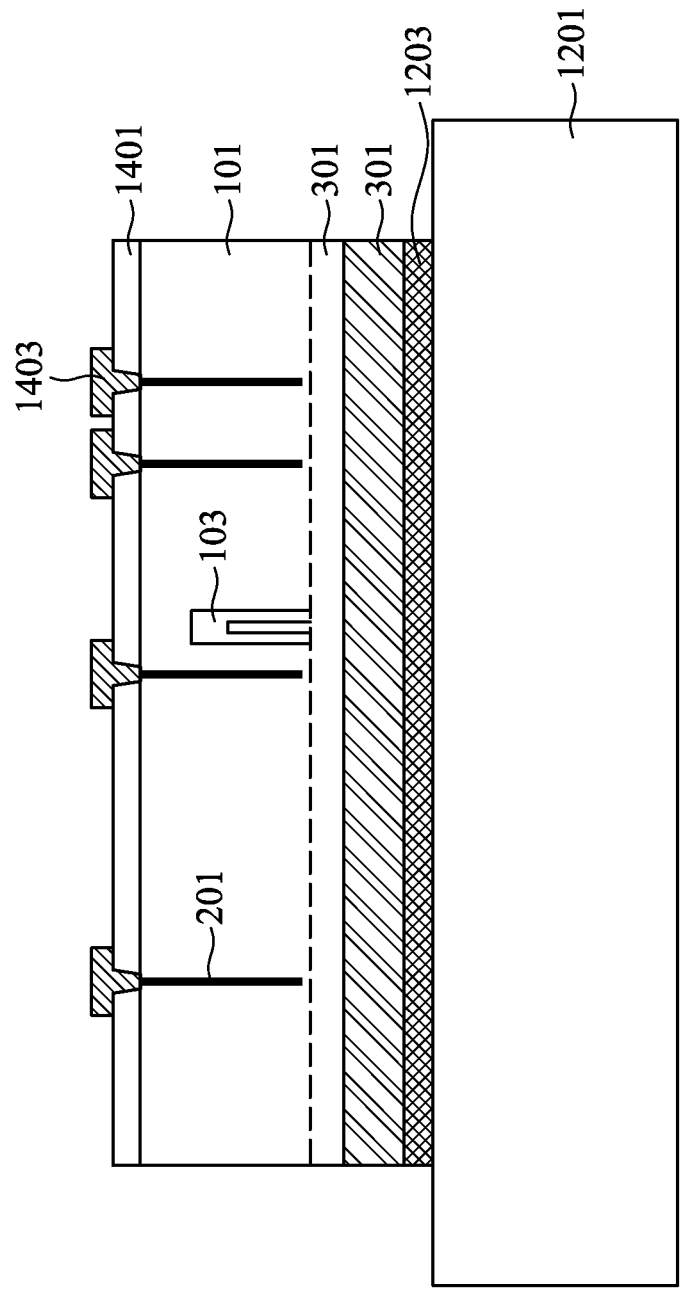
FIG. 14 illustrates forming metallization layers on the capacitor chip, in accordance with some embodiments.

FIG. 14 illustrates that, once the through vias 201 are exposed, fourth metallization layers 1401 may be formed in electrical connection with the through vias 201. In an embodiment the fourth metallization layers 1401 may be similar to and formed the same way as the first metallization layers 301, such as comprising a series of interleaving conductive and dielectric layers formed using damascene and/or dual damascene processes. However, any suitable materials and processes may be utilized.

Additionally, once the fourth metallization layers 1401 have been formed, second contact pads 1403 may also be formed. The second contact pads 1403 may comprise copper (e.g., different from the first underbump metallizations 403), but other materials, such as aluminum (e.g., the same as the first underbump metallizations 403), may be used. The second contact pads 1403 may be formed using a deposition process, such as sputtering, to form a layer of material and portions of the layer of material may then be removed through a suitable process (such as photolithographic masking and etching) to form the second contact pads 1403. However, any other suitable process may be utilized to form the second contact pads 1403. The second contact pads 1403 may be formed to have a thickness of between about 0.1 µm and about 10 µm, such as about 1.45 µm.

Figure 15:
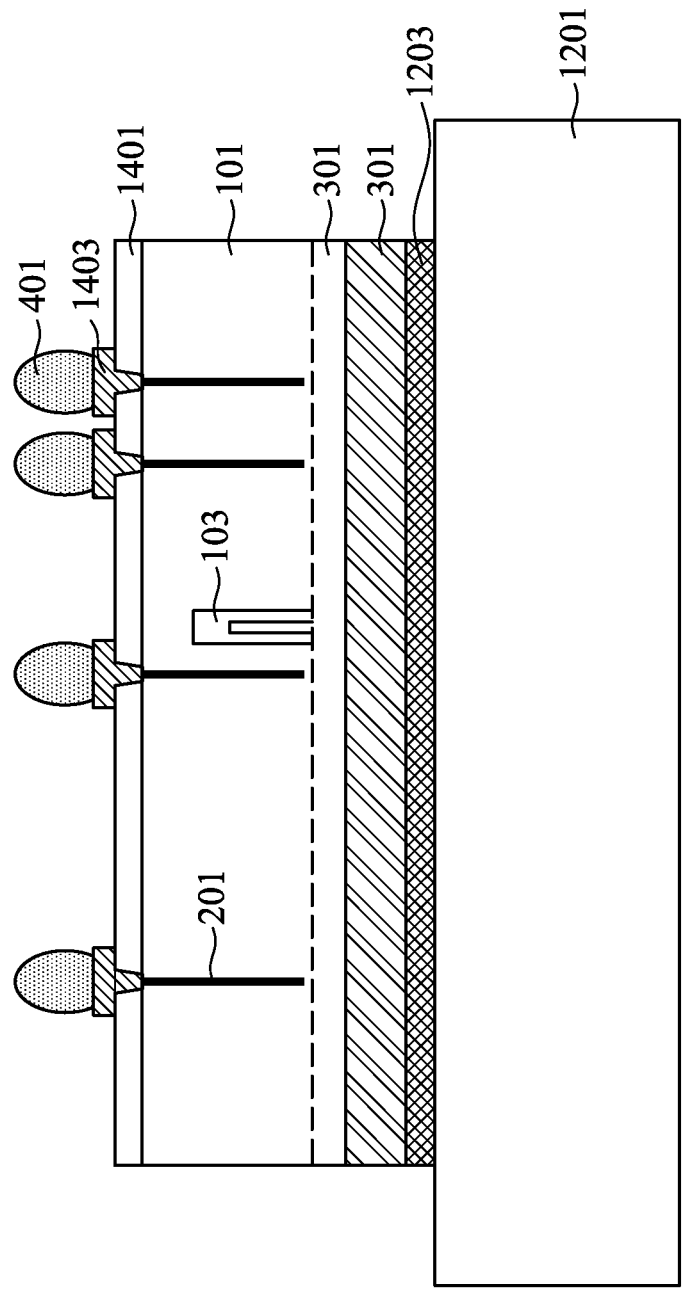
FIG. 15 illustrates formation of external connectors, in accordance with some embodiments.

FIG. 15 illustrates that, once the fourth metallization layers 1401 and the second contact pads 1403 have been formed, the first external connectors 401 are formed. As described above with respect to FIG. 4, the first external connectors 401 may be contact bumps such as microbumps or controlled collapse chip connection (C4) bumps and may comprise a material such as tin, or other suitable materials, such as silver or copper. In an embodiment in which the first external connectors 401 are tin solder bumps, the first external connectors 401 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Figure 16:
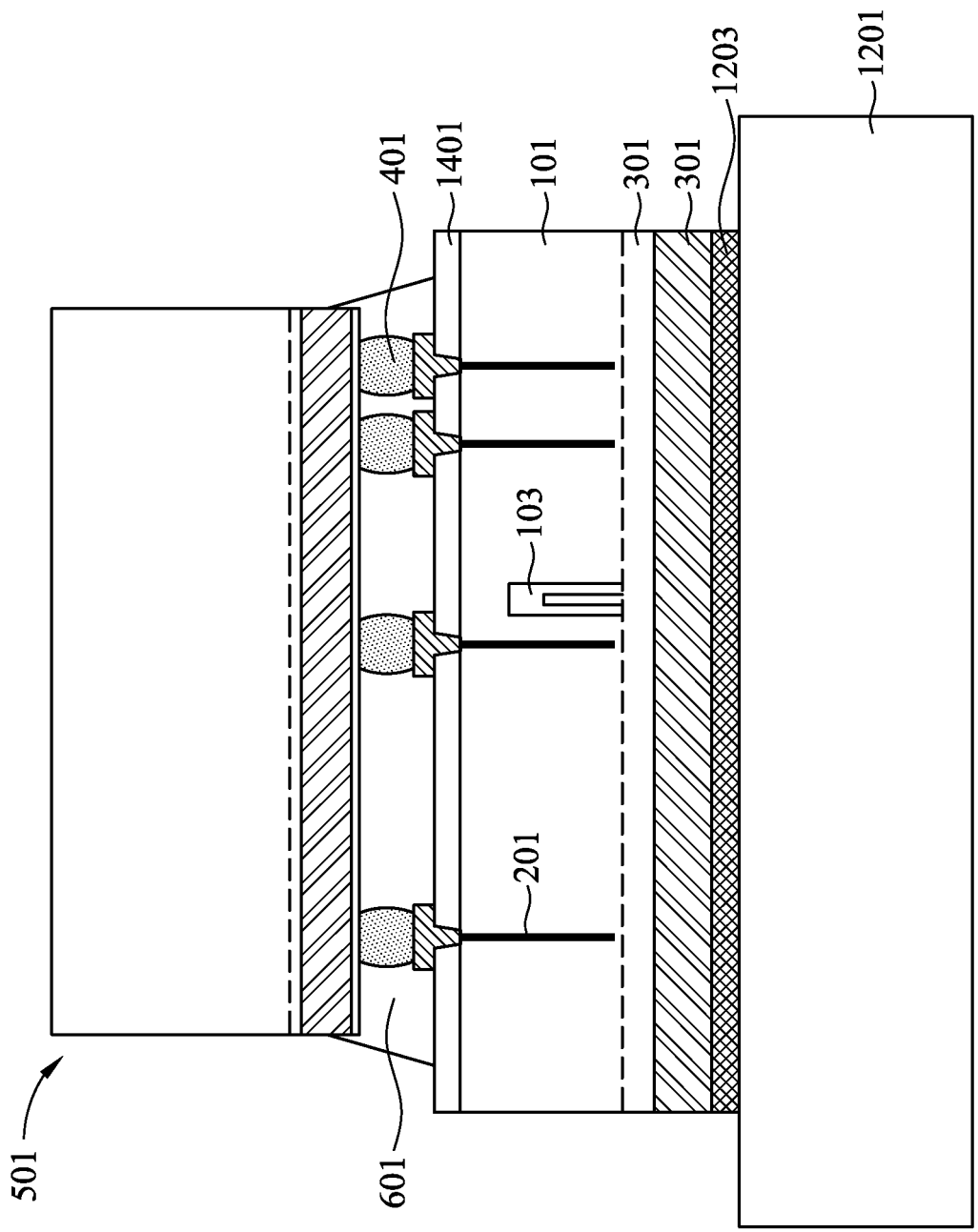
FIG. 16 illustrates attachment of the first semiconductor device, in accordance with some embodiments.

FIG. 16 illustrates that, once the first external connectors 401 have been formed, the first semiconductor device 501 is bonded to the first external connectors 401. In an embodiment in which the first external connectors 401 uses connectors such as solder balls, once the first semiconductor device 501 has been placed a reflow process may be performed in order to physically bond the first semiconductor device 501 with the underlying first external connectors 401. However, any other suitable connector or connection process may be utilized, such as metal-to-metal bonding or the like.

FIG. 16 additionally illustrates that, once the first semiconductor device 501 has been bonded, the first underfill 601 may be applied. In an embodiment the first underfill 601 is a protective material used to cushion and support the first semiconductor device 501 and the semiconductor substrate 101 from operational and environmental degradation, such as stresses caused by the generation of heat during operation. The first underfill 601 may be placed using an injection process with capillary action or may be otherwise formed in the space between the first semiconductor device 501 and the semiconductor substrate 101 and may, for example, comprise a liquid epoxy that is dispensed between the first semiconductor device 501 and the semiconductor substrate 101 and then cured to harden.

Figure 17:
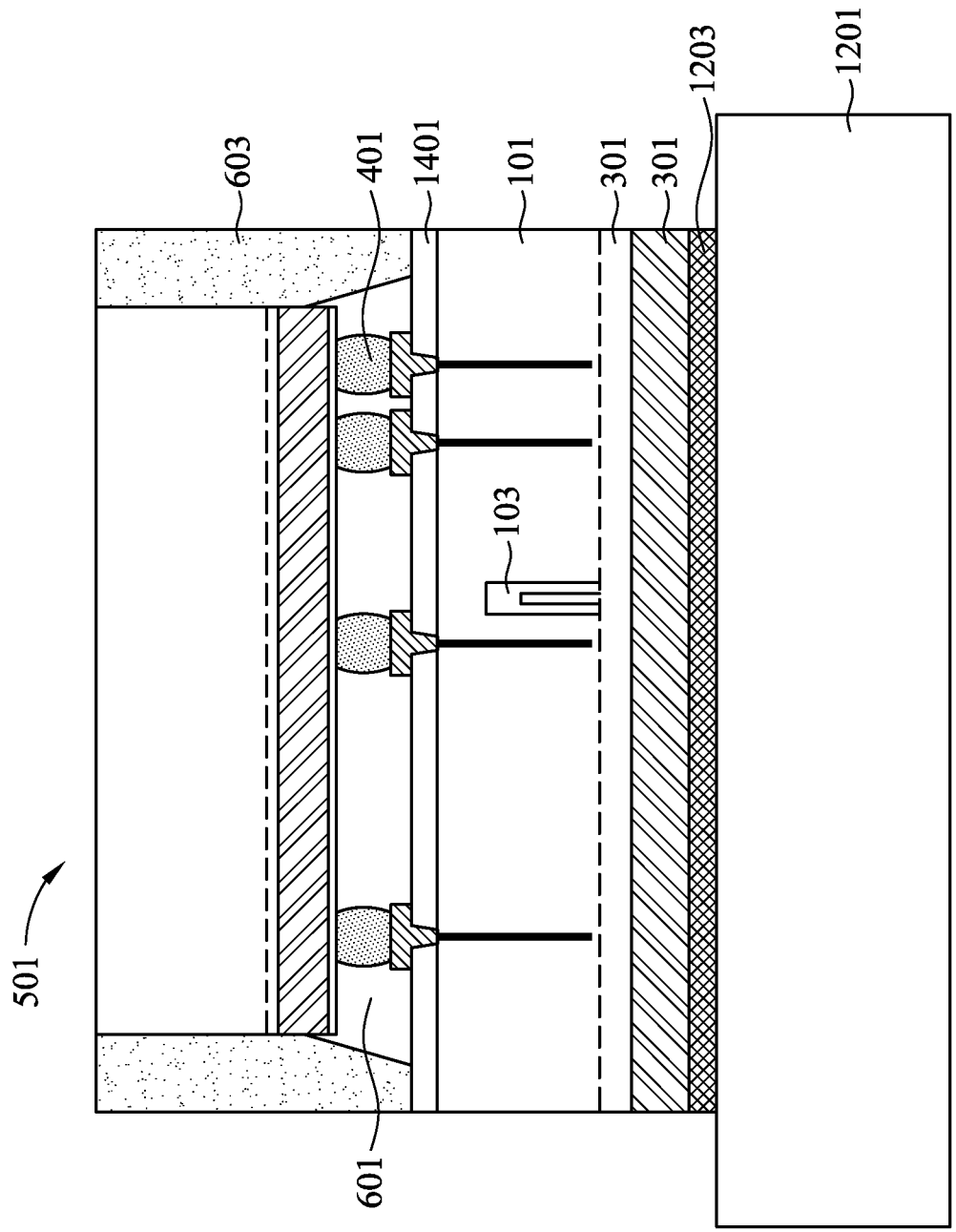
FIG. 17 illustrates an encapsulation of the first semiconductor device, in accordance with some embodiments.

FIG. 17 illustrates that, once the first underfill 601 has been applied, the first encapsulant 603 is applied. In an embodiment the first encapsulant 603 is applied as described above with respect to FIG. 6. Further, once applied, the first encapsulant 603 may be thinned as described above with respect to FIG. 6 in order to expose the first semiconductor device 501 and planarize the first encapsulant 603 with the first semiconductor device 501. However, any suitable material and processes may be utilized.

Finally, at this point, a singulation may be performed. In an embodiment the singulation may be performed using one or more saw blades. However, any suitable method of singulation, including laser ablation or one or more wet etches, may also be utilized.

Figure 18:
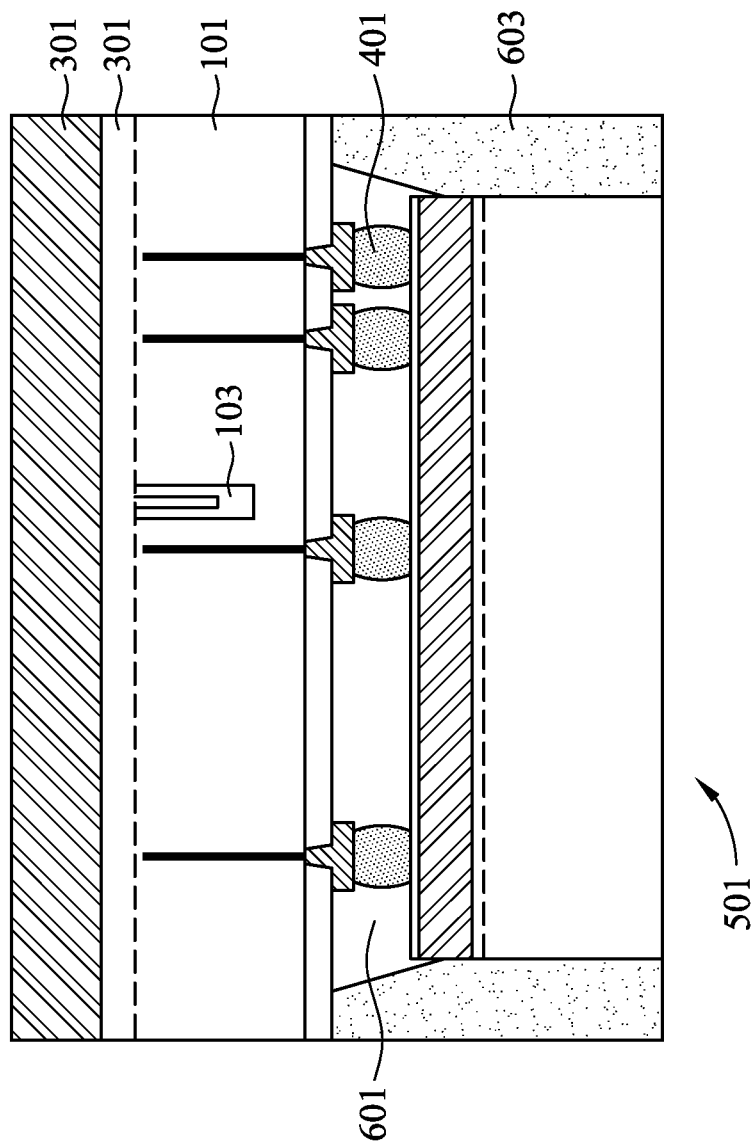
FIG. 18 illustrates a removal of the carrier wafer, in accordance with some embodiments.

FIG. 18 illustrates that, once the singulation has been performed, the first carrier substrate 1201 is removed. In an embodiment the first carrier substrate 1201 is physically removed and then the adhesive 1203 is physically removed from the first metallization layers 301. As such, the first metallization layers 301 are exposed for further processing.

Figure 19:
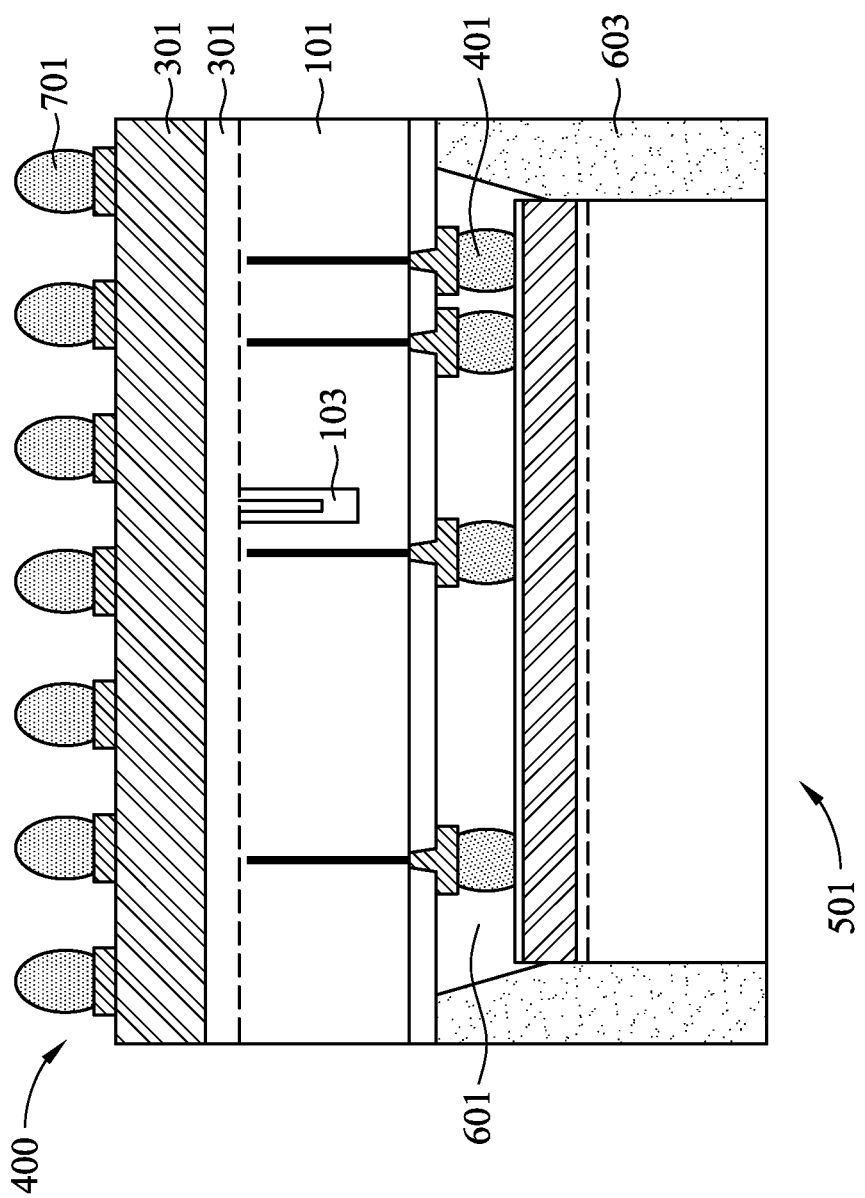
FIG. 19 illustrates formation of external connections, in accordance with some embodiments.

FIG. 19 illustrates that after the first metallization layers 301 have been exposed, the second external connections 701 are formed. In an embodiment the second external connections 701 are formed as described above with respect to FIG. 7, wherein the second external connections 701 are microbumps. However, any suitable methods and materials may be utilized.

Additionally, while some of the embodiments discussed above utilize a structure in which all of the capacitors 103 are located within the DTC chip 400 and the first semiconductor device 501 does not comprise any functional capacitors, this is intended to be illustrative and is not intended to be limiting. Rather, any suitable combination and location of capacitors may be utilized. For example, in another embodiment, while the DTC chip 400 comprises deep trench capacitors, the first semiconductor device 501 also comprises capacitors, which may be deep trench capacitors or other types of capacitors. In such an embodiment the capacitors 103 located within the DTC chip 400 have a larger capacitance than the capacitors located within the first semiconductor device 501. In a particular embodiment the capacitors 103 located within the DTC chip 400 may have a capacitance of between about 0.32 $\mu F/mm^2$ and about 0.64 $\mu F/mm^2$ while the capacitors within the first semiconductor device 501 may have a capacitance of between about 0.022 $\mu F/mm^2$ and about 0.044 $\mu F/mm^2$. However, any suitable capacitances may be utilized.

Figure 20A:
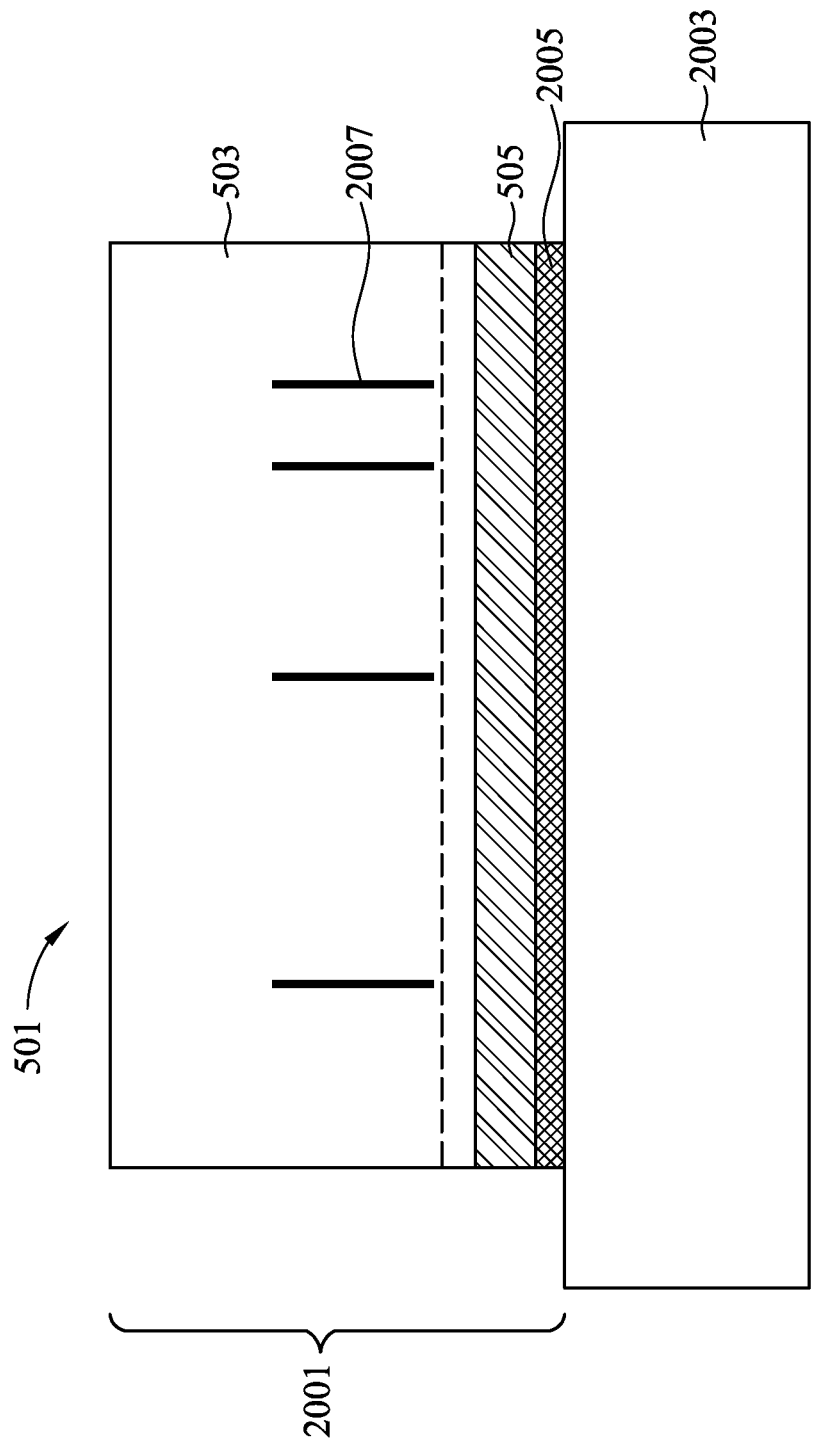
FIGS. 20A-20C illustrate formation of a face-to-back connection, in accordance with some embodiments.
Figure 20B:
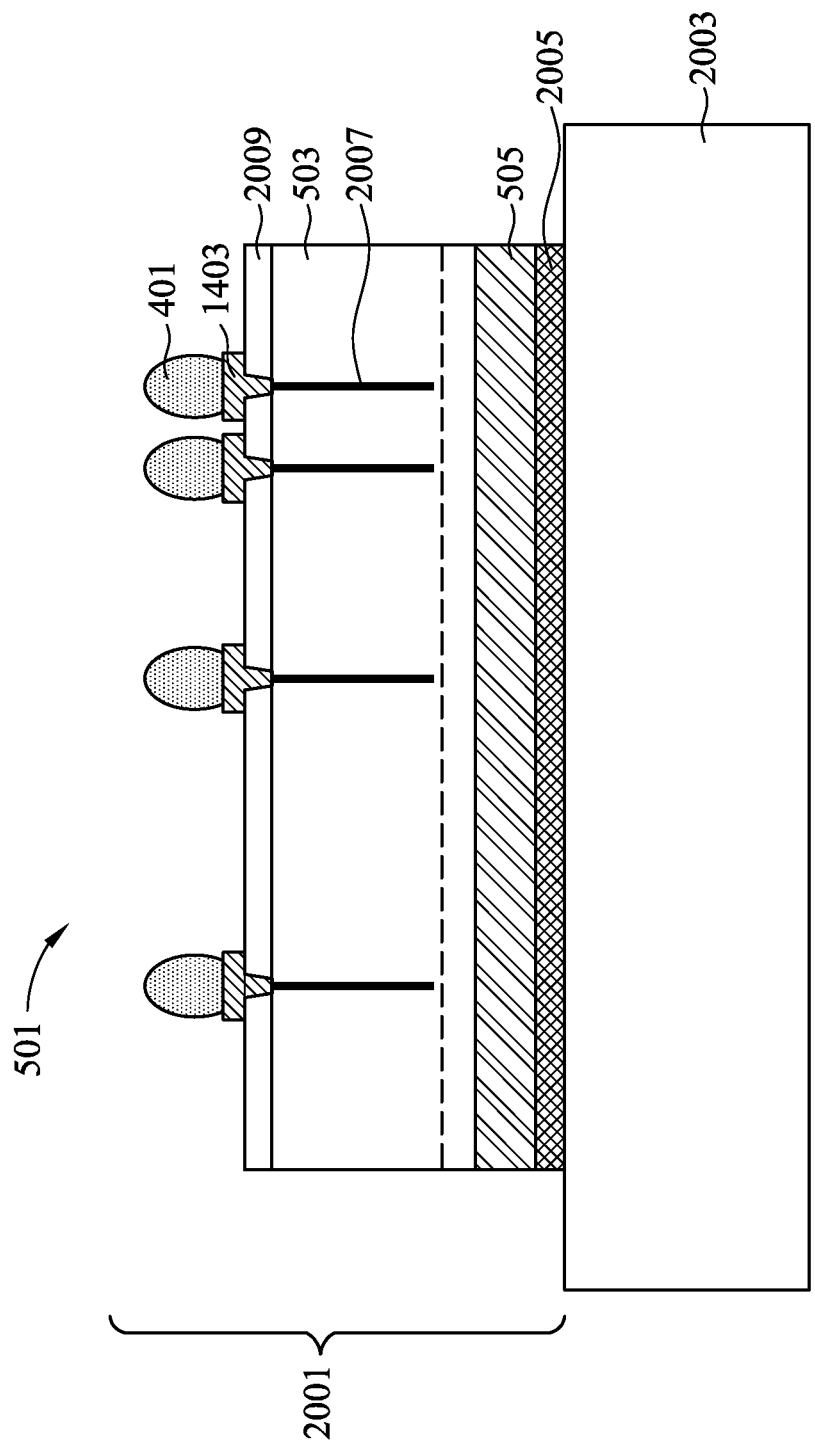
Figure 20C:
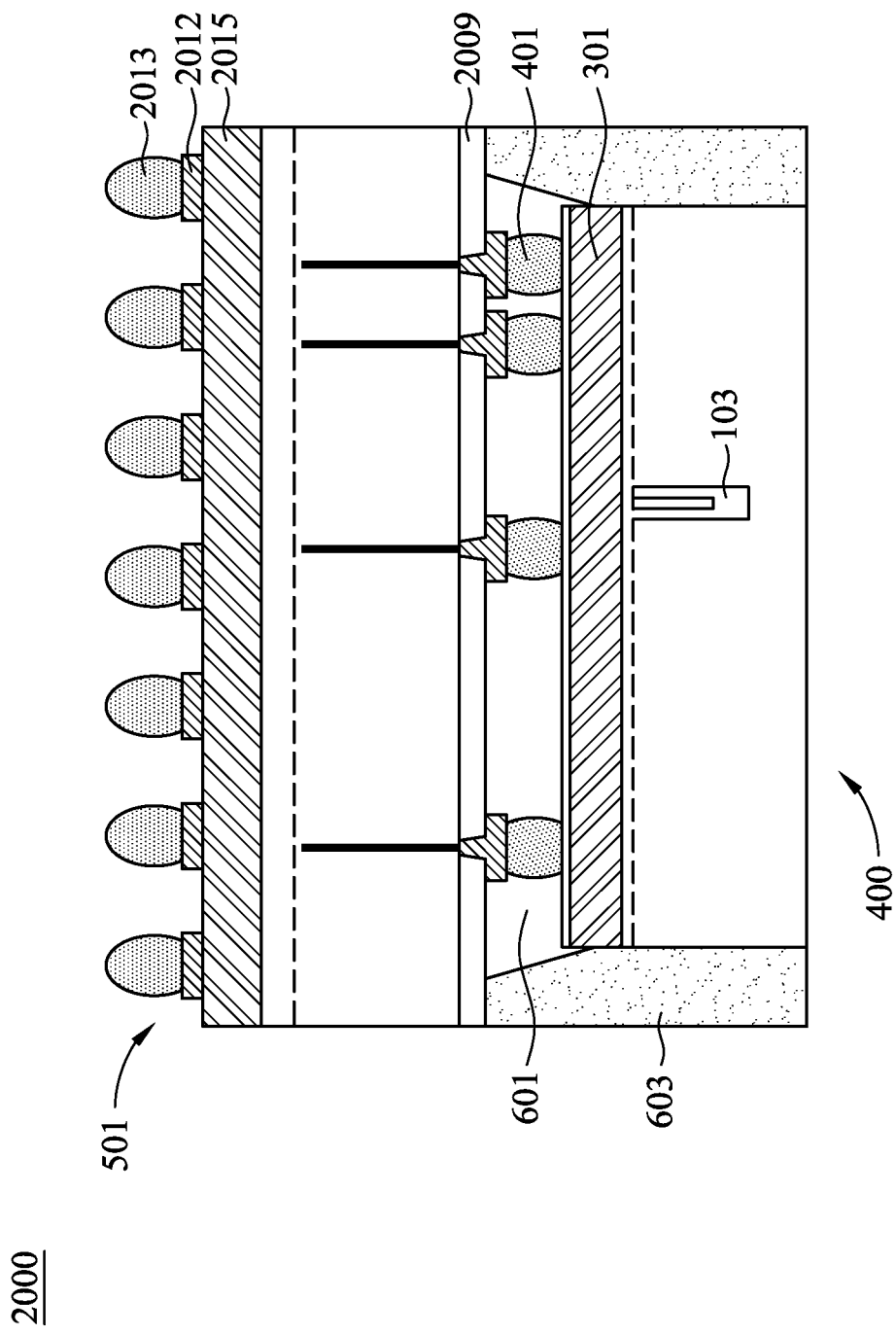

FIGS. 20A-20C illustrate another embodiment in which the first semiconductor device 501 is connected to the DTC chip 400, wherein the first semiconductor device 501 remains part of a wafer 2001 during the bonding process, in a face-to-back bonding configuration. In this embodiment, the first semiconductor device 501 is manufactured as describe above, but without the formation of the second underbump metallization layers 507. Instead, prior to formation of the second underbump metallizations layers 507, the second metallization layers 505 are bonded to a second carrier substrate 2003 with, e.g., a second adhesive 2005. In an embodiment the second carrier substrate 2003 may be similar to the first carrier substrate 1201 (described above with respect to FIG. 12) while the second adhesive 2005 may be similar to the adhesive 1203 (described above with respect to FIG. 12). However, any suitable method or materials may be utilized to bond the first semiconductor device 501 to the second carrier substrate 2003.

Additionally in this embodiment, the first semiconductor device 501 may be formed with second through vias 2007 formed within the second semiconductor substrate 503. In an embodiment the second through vias 2007 may be formed using similar processes and materials as the through vias 201, described above with respect to FIG. 2. However, any suitable processes and materials may be utilized.

FIG. 20B illustrates that, once the first semiconductor device 501 within the wafer 2001 is bonded or otherwise attached to the second carrier substrate 2003, the second semiconductor substrate 503 is thinned to expose the second through vias 2007. In an embodiment the second semiconductor substrate 503 may be thinned using a planarization process, such as chemical mechanical polishing (CMP). However, any suitable thinning may be utilized.

FIG. 20B additionally illustrates that, after the second through vias 2007 have been exposed, optional fifth metallization layers 2009 may be formed, second contact pads 1403 may be formed over the fifth metallization layers 2009, and the first external connectors 401 may be formed. In an embodiment the fifth metallization layers 2009 may be formed similar to the first metallization layers 301, the second contact pads 1403 may be formed as described above with respect to FIG. 14, and the first external connectors 401 may be formed as describe above with respect to FIG. 4. However, any suitable methods and materials may be utilized.

FIG. 20C illustrates that, once the first external connectors 401 have been formed, the DTC chip 400 (which has already been singulated in this embodiment) is bonded to the wafer 2001. In an embodiment the DTC chip 400 is aligned with the first external connectors 401 using, e.g., a pick and place process, and the first external connectors 401 are then reflowed in order to bond the DTC chip 400 to the first semiconductor device 501 within the wafer 2001. However, any suitable process may be utilized.

FIG. 20C additionally illustrates that, after bonding, the first underfill 601 is applied and the first encapsulant 603 is used to encapsulate the DTC chip 400 (instead of the first semiconductor device 501). In an embodiment the first underfill 601 and the first encapsulant 603 are placed as described above with respect to FIG. 6. However, any suitable methods and materials may be utilized.

After the DTC chip 400 has been encapsulated, the wafer 2001 is singulated. In an embodiment the singulation may be performed using one or more saw blades. However, any suitable method of singulation, including laser ablation or one or more wet etches, may also be utilized. By performing the singulation at this point, a second integrated capacitor device 2000 may be formed.

Once formed, the second carrier substrate 2003 and the second adhesive 2005 are removed from the second integrated capacitor device 2000. In an embodiment the second carrier substrate 2003 and second adhesive 2005 may be removed as described above with respect to FIG. 18. However, any suitable method may be utilized.

Once the second carrier substrate 2003 has been removed, sixth metallization layers 2015, third contact pads 2011, and sixth external connectors 2013 are formed. In an embodiment the sixth metallization layers 2015 may be formed similar to the fourth metallization layers 1401, the third contact pads 2011 may be formed similar to the second contact pads 1403, and the sixth external connectors 2013 may be formed similar to the first external connectors 401. In this embodiment, however, the sixth metallization layers 2015, the third contact pads 2011, and the sixth external connectors 2013 are formed on the first semiconductor device 501 instead of the DTC chip 400. However, any suitable methods and materials may be utilized.

Additionally, while some of the embodiments discussed above utilize a structure in which all of the capacitors 103 are located within the DTC chip 400 and the first semiconductor device 501 does not comprise any functional capacitors, this is intended to be illustrative and is not intended to be limiting. Rather, any suitable combination and location of capacitors may be utilized. For example, in another embodiment, while the DTC chip 400 comprises deep trench capacitors, the first semiconductor device 501 also comprises capacitors, which may be deep trench capacitors or other types of capacitors. In such an embodiment the capacitors 103 located within the DTC chip 400 have a larger capacitance than the capacitors located within the first semiconductor device 501. In a particular embodiment the capacitors 103 located within the DTC chip 400 may have a capacitance of between about 0.32 $\mu F/mm^2$ and about 0.64 $\mu F/mm^2$ while the capacitors within the first semiconductor device 501 may have a capacitance of between about 0.022 $\mu F/mm^2$ and about 0.044 $\mu F/mm^2$. However, any suitable capacitances may be utilized.

Figure 21A:
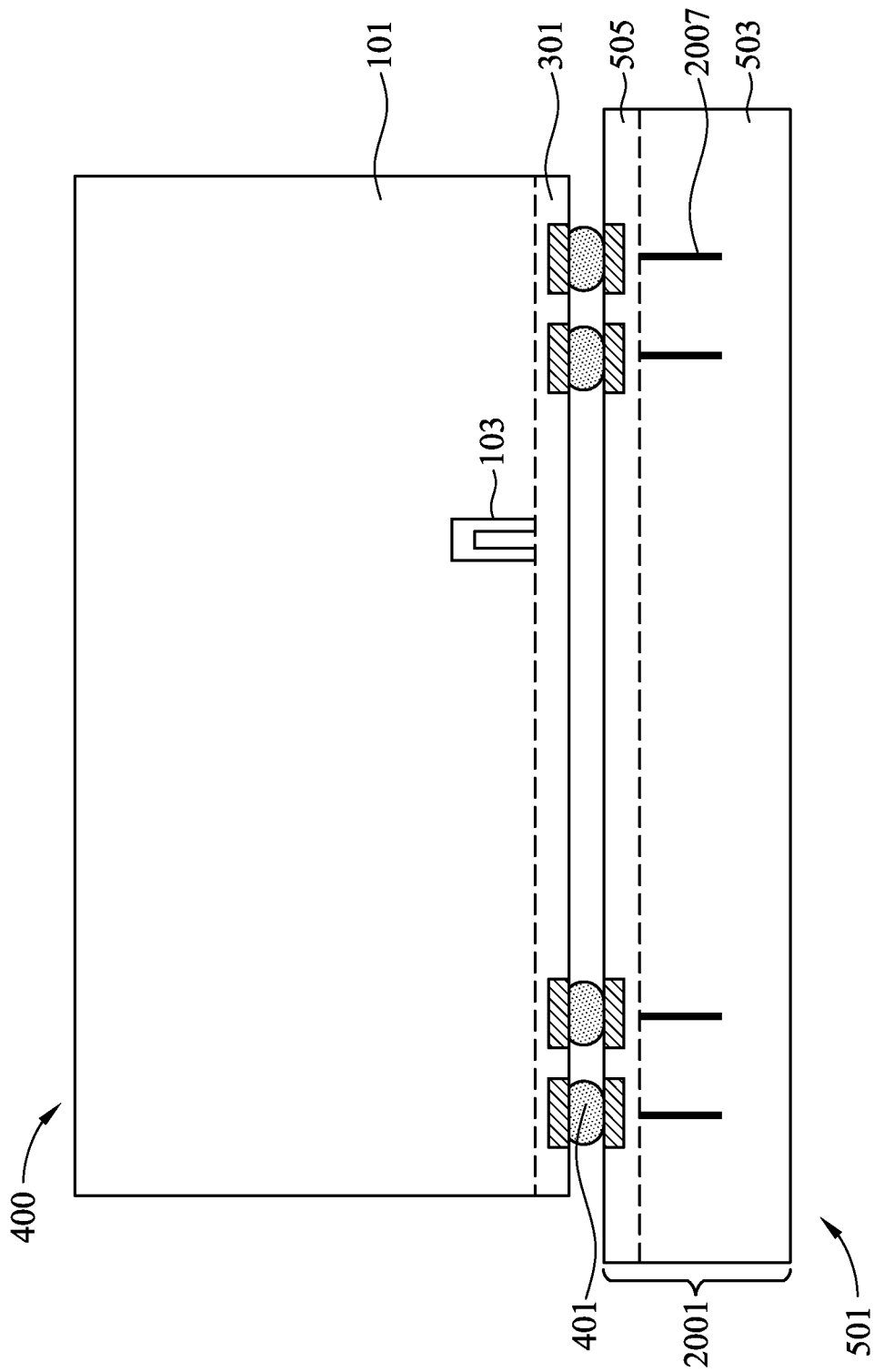
FIGS. 21A-21B illustrate a face-to-face connection, in accordance with some embodiments.
Figure 21B:
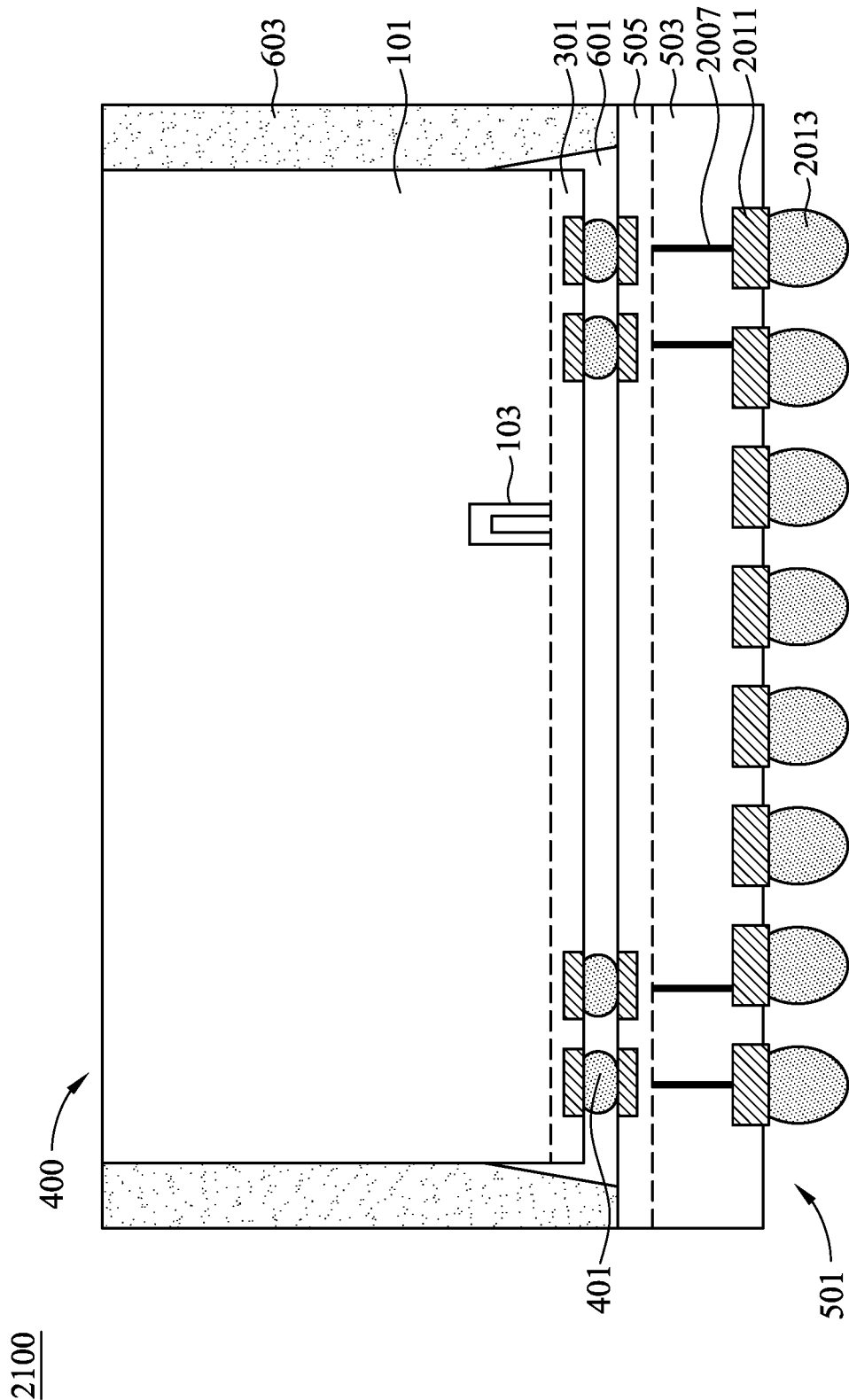

FIGS. 21A-21B illustrate yet another embodiment in which the first semiconductor device 501 is connected to the DTC chip 400 while the first semiconductor device 501 remains part of a wafer 2001. In this embodiment, however, the first semiconductor device 501 is bonded to the DTC chip 400 in a face-to-face combination.

Looking first at FIG. 21A, in this embodiment the first semiconductor device 501 (within the wafer 2001) is aligned with the DTC chip 400 using, e.g., a pick and place process. Once in place, the first semiconductor device 501 and the DTC chip 400 are bonded to each other using, e.g., the first external connectors 401. In an embodiment the bonding may be performed using, e.g., a reflow process. However, any suitable bonding process may be utilized.

FIG. 21B illustrates that, once the first semiconductor device 501 is bonded to the DTC chip 400, the first underfill 601 is applied and the first encapsulant 603 is used to encapsulate the DTC chip 400 (instead of the first semiconductor device 501). In an embodiment the first underfill 601 and the first encapsulant 603 are placed as described above with respect to FIG. 6. However, any suitable methods and materials may be utilized.

FIG. 21B additionally illustrates that, once the DTC chip 400 has been encapsulated in this embodiment, the second semiconductor substrate 503 of the first semiconductor device 501 may be thinned in order to expose the second through vias 2007. In an embodiment the second semiconductor substrate 503 may be thinned using a planarization process, such as chemical mechanical polishing (CMP). However, any suitable thinning may be utilized.

FIG. 21B additionally illustrates that, after the second through vias 2007 have been exposed, the third contact pads 2011 and the sixth external connectors 2013 may be formed. In an embodiment the third contact pads 2011 and the sixth external connectors 2013 may be formed as described above with respect to FIGS. 20A-20B. However, any suitable methods and materials may be utilized.

Finally, after the sixth external connectors 2013 have been formed, the wafer 2001 is singulated. In an embodiment the singulation may be performed using one or more saw blades. However, any suitable method of singulation, including laser ablation or one or more wet etches, may also be utilized. By performing the singulation at this point, a third integrated capacitor device 2100 may be formed.

Additionally, while some of the embodiments discussed above utilize a structure in which all of the capacitors 103 are located within the DTC chip 400 and the first semiconductor device 501 does not comprise any functional capacitors, this is intended to be illustrative and is not intended to be limiting. Rather, any suitable combination and location of capacitors may be utilized. For example, in another embodiment, while the DTC chip 400 comprises deep trench capacitors, the first semiconductor device 501 also comprises capacitors, which may be deep trench capacitors or other types of capacitors. In such an embodiment the capacitors 103 located within the DTC chip 400 have a larger capacitance than the capacitors located within the first semiconductor device 501. In a particular embodiment the capacitors 103 located within the DTC chip 400 may have a capacitance of between about 0.32 $\mu F/mm^2$ and about 0.64 $\mu F/mm^2$ while the capacitors within the first semiconductor device 501 may have a capacitance of between about 0.022 $\mu F/mm^2$ and about 0.044 $\mu F/mm^2$. However, any suitable capacitances may be utilized.

By placing the capacitors 103 separately from the first semiconductor device 501, a larger capacitance with a lower impedance at higher frequencies can be obtained. Additionally, by putting the capacitors 103 onto the DTC chip 400 (instead of other substrates such as the interposer 801 or other semiconductor devices), the capacitors 103 can be located closer to the first semiconductor device 501, allowing for shorter connections and an overall improved performance.

In accordance with an embodiment, a method of manufacturing a semiconductor device, the method including: providing a capacitor chip, the capacitor chip comprising a deep trench capacitor; bonding a first semiconductor die to the capacitor chip; encapsulating a first one of the capacitor chip and the first semiconductor die with a first encapsulant; thinning a second one of the capacitor chip and the first semiconductor die to expose through vias; bonding the second one of the capacitor chip and the first semiconductor die to an interposer; and bonding the interposer to a substrate. In an embodiment the method further includes encapsulating the first encapsulant with a second encapsulant. In an embodiment after the bonding the first semiconductor die to the capacitor chip, a face of the capacitor chip faces the first semiconductor die and a face of the first semiconductor die faces the capacitor chip. In an embodiment after the bonding the first semiconductor die to the capacitor chip, a face of the capacitor chip faces away from the first semiconductor die and a face of the first semiconductor die faces away from the capacitor chip. In an embodiment after the bonding the first semiconductor die to the capacitor chip, a face of the capacitor chip faces away from the first semiconductor die and a face of the first semiconductor die faces the capacitor chip. In an embodiment after the bonding the first semiconductor die to the capacitor chip, a face of the capacitor chip faces the first semiconductor die and a face of the first semiconductor die faces away from the capacitor chip. In an embodiment the first semiconductor die is free from capacitors In accordance with another embodiment, a method of manufacturing a semiconductor device, the method includes: combining a capacitor chip and a first semiconductor die into a first structure; embedding at least a part of the first structure into a first encapsulant; thinning the first structure to expose through vias; connecting the through vias to an interposer; bonding a second semiconductor die to the interposer; embedding the second semiconductor die and the combination into a second encapsulant; and connecting the interposer to a substrate. In an embodiment the first semiconductor die is a system on chip device. In an embodiment the capacitor chip comprises a deep trench capacitor. In an embodiment the combining the capacitor chip and the first semiconductor die bonds the capacitor chip to a semiconductor wafer. In an embodiment the combining the capacitor chip and the first semiconductor die bonds the first semiconductor die to a semiconductor wafer. In an embodiment the thinning the first structure thins the capacitor chip. In an embodiment the thinning the first structure thins the first semiconductor die.

In accordance with yet another embodiments, a semiconductor device includes: an interposer over a substrate; a first integrated capacitor device bonded to the interposer, the first integrated capacitor device includes: a capacitor chip; a first semiconductor die bonded to the capacitor chip; and through vias extending through a semiconductor substrate of the first integrated capacitor device; a second semiconductor die bonded to the interposer; and an encapsulant encapsulating the first integrated capacitor device and the second semiconductor die. In an embodiment the semiconductor substrate is part of the capacitor chip. In an embodiment the semiconductor substrate is part of the first semiconductor die. In an embodiment a face of the capacitor chip faces the first semiconductor die and a face of the first semiconductor die faces the capacitor chip. In an embodiment a face of the capacitor chip faces away from the first semiconductor die and a face of the first semiconductor die faces away from the capacitor chip. In an embodiment a face of the capacitor chip faces away from the first semiconductor die and a face of the first semiconductor die faces the capacitor chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    combining a capacitor chip and a first semiconductor die into a first structure;
    embedding at least a part of the first structure into a first encapsulant;
    thinning the first structure to expose through vias;
    connecting the through vias to an interposer;
    bonding a second semiconductor die to the interposer;
    embedding the second semiconductor die and the first structure into a second encapsulant; and
    connecting the interposer to a substrate.

2. The method of claim 1, wherein the first semiconductor die is a system on chip device.

3. The method of claim 2, wherein the capacitor chip comprises a deep trench capacitor.

4. The method of claim 1, wherein the combining the capacitor chip and the first semiconductor die bonds the capacitor chip to a semiconductor wafer.

5. The method of claim 1, wherein the combining the capacitor chip and the first semiconductor die bonds the first semiconductor die to a semiconductor wafer.

6. The method of claim 1, wherein the thinning the first structure thins the capacitor chip.

7. The method of claim 1, wherein the thinning the first structure thins the first semiconductor die.

8. A method of manufacturing a semiconductor device, the method comprising:

combining a capacitor chip and a first semiconductor die into a first structure;
embedding at least a part of the first structure into a first encapsulant;
thinning the first structure to expose through vias;
connecting the through vias to an interposer;
bonding a second semiconductor die and a third semiconductor die to the interposer;
embedding the second semiconductor die and the first structure into a second encapsulant; and
connecting the interposer to a substrate.

9. The method of claim 8, wherein the first semiconductor die is a system on chip device.

10. The method of claim 9, wherein the capacitor chip comprises a deep trench capacitor.

11. The method of claim 8, wherein the combining the capacitor chip and the first semiconductor die bonds the capacitor chip to a semiconductor wafer.

12. The method of claim 8, wherein the combining the capacitor chip and the first semiconductor die bonds the first semiconductor die to a semiconductor wafer.

13. The method of claim 8, wherein the thinning the first structure thins the capacitor chip.

14. The method of claim 8, wherein the thinning the first structure thins the first semiconductor die.

15. A method of manufacturing a semiconductor device, the method comprising:
combining a capacitor chip and a first semiconductor die into a first structure;
embedding at least a part of the first structure into a first encapsulant;
thinning the first structure to expose through vias;
connecting the through vias to an interposer;
bonding a second semiconductor die to the interposer;
embedding the second semiconductor die and the first structure into a second encapsulant, the second encapsulant being in physical contact with the first encapsulant; and
connecting the interposer to a substrate.

16. The method of claim 15, wherein the first semiconductor die is a system on chip device.

17. The method of claim 16, wherein the capacitor chip comprises a deep trench capacitor.

18. The method of claim 15, wherein the combining the capacitor chip and the first semiconductor die bonds the capacitor chip to a semiconductor wafer.

19. The method of claim 15, wherein the combining the capacitor chip and the first semiconductor die bonds the first semiconductor die to a semiconductor wafer.

20. The method of claim 15, wherein the thinning the first structure thins the capacitor chip.

* * * * *